(12) United States Patent
Awal et al.

(10) Patent No.: US 11,108,235 B1
(45) Date of Patent: Aug. 31, 2021

(54) DOUBLE SYNCHRONOUS UNIFIED VIRTUAL OSCILLATOR CONTROL FOR GRID-FORMING AND GRID-FOLLOWING POWER ELECTRONIC CONVERTERS

(71) Applicant: North Carolina State University, Raleigh, NC (US)

(72) Inventors: M A Awal, Raleigh, NC (US); Iqbal Husain, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 17/173,505

(22) Filed: Feb. 11, 2021

Related U.S. Application Data

(60) Provisional application No. 62/972,791, filed on Feb. 11, 2020.

(51) Int. Cl.
*H03B 5/10* (2006.01)
*H03J 7/04* (2006.01)
*H03L 7/099* (2006.01)
*H02J 3/24* (2006.01)
*H02J 3/00* (2006.01)
*H03B 5/02* (2006.01)

(52) U.S. Cl.
CPC ............. *H02J 3/24* (2013.01); *H02J 3/0012* (2020.01); *H03B 5/02* (2013.01)

(58) Field of Classification Search
CPC ............. H02J 3/24; H02J 3/0012; H03B 5/02
USPC ..................................... 331/177 R
See application file for complete search history.

(56) References Cited

U.S. PATENT DOCUMENTS

| | | | |
|---|---|---|---|
| 6,295,215 B1 * | 9/2001 | Faria | H02J 9/062 363/124 |
| 2017/0279376 A1 * | 9/2017 | Siri | H02M 1/12 |

* cited by examiner

*Primary Examiner* — Richard Tan
(74) *Attorney, Agent, or Firm* — Thomas | Horstemeyer, LLP

(57) ABSTRACT

A power electronic converter can utilize exemplary double synchronous unified virtual oscillator control (DSUVOC) logic or circuitry to convert direct current to alternating current that is input into a power grid. An exemplary DSUVOC controller of the present disclosure includes a double synchronous space vector oscillator component, a sequence extraction component, a fault detection component, a pre-synchronization component, a virtual impedance component, a terminal voltage compensation component, and/or an active damping component, wherein the double synchronous unified virtual oscillator controller is capable of controlling a grid following or a grid forming power electronic converter enabling synchronization and fault ride-through under both balanced and unbalanced conditions.

20 Claims, 25 Drawing Sheets

DOUBLE SYNCHRONOUS UNIFIED VIRTUAL OSCILLATOR CONTROL FOR GRID-FORMING AND GRID-FOLLOWING POWER ELECTRONIC CONVERTERS

CROSS-REFERENCE TO RELATED APPLICATION

This application claims priority to U.S. provisional application entitled, "Universal Oscillator Control for Grid Following and Grid Forming Converters," having Ser. No. 62/972,791, filed Feb. 11, 2020, which is entirely incorporated herein by reference.

STATEMENT REGARDING FEDERALLY SPONSORED RESEARCH OR DEVELOPMENT

This invention was made with government support under Grant No. EEC-0812121 awarded by the National Science Foundation. The government has certain rights in the invention.

BACKGROUND

With the increasing penetration of distributed generation resources into the power system, coordinated control of low-inertia systems has garnered significant research efforts [1]. Grid-forming (GFM) converters (GFMCs) are considered to be a key enabling technology for the future grid with reduced inertia [2]. The prevalent and most widely investigated control strategies for GFMCs have been developed based on mimicking the characteristics of synchronous machines by voltage source converters (VSCs). Droop control [3], power synchronization control (PSC) [4], synchronverters [5], virtual synchronous machines (VSM/VISMA) [6], and synchronous power controllers (SPC) [7] are examples of emulation based GFM control methods.

However, power electronic converters can provide minimal inertial response and are typically designed with very limited over-current capability. The synchronization among droop-based resources has been studied using phase-coupled oscillator models which are well defined only in the near synchronous time scale, and therefore, provide good approximation of dynamic behavior only in networks with significant inertia.

To circumvent phasor based approximate modelling and design, a class of nonlinear control methods has been proposed which leverage the well established theoretical results on synchronization in oscillator networks. In papers by Johnson et al. (B. B. Johnson, S. V. Dhople, A. O. Hamadeh, and P. T. Krein, "Synchronization of Parallel Single-Phase Inverters With Virtual Oscillator Control," *IEEE Transactions on Power Electronics*, vol. 29, no. 11, pp. 6124-6138, November 2014 and B. B. Johnson, M. Sinha, N. G. Ainsworth, F. Dorfler, and S. V. Dhople, "Synthesizing Virtual Oscillators to Control Islanded Inverters," *IEEE Transactions on Power Electronics*, vol. 31, no. 8, pp. 6002-6015, August 2016) [8], [9], VSCs are controlled to emulate the dynamics of weakly nonlinear limit-cycle oscillators, such as the dead-zone oscillator and the Van der Pol oscillator. These class of so-called virtual oscillator control (VOC) methods incorporate a droop like terminal response implicitly embedded in their nonlinear dynamics. However, VOC requires a design trade-off between transient performance and harmonic distortion, specially $3^{rd}$ harmonic, in the output voltage.

Moreover, VOC is non-ideal for three-phase application and, for explicit real and reactive power dispatch, additional compensation loops with distinct time-scale separation are required [10]. Another oscillator based method, well-suited for three phase implementation, was recently proposed which enables explicit power and voltage reference dispatch [11]-[13]. This so-called dispatchable virtual oscillator control (dVOC) utilizes super-critical Andronov-Hopf bifurcation which leads to a unique and stable limit-cycle behavior [14]. The theoretical development of dVOC was inspired by consensus in multi-agent networks, and therefore, the controller design was presented in a network-oriented top-down approach [11]. A different approach for the controller parameter selection based on the voltage and current capacity of the power electronic converter was presented in a paper by Lu, et al. (M. Lu, S. Dutta, V. Purba, S. Dhople, and B. Johnson, "A Grid-compatible Virtual Oscillator Controller: Analysis and Design," in 2019 *IEEE Energy Conversion Congress and Exposition (ECCE)*, 2019) [13].

Overall, VOC and dVOC have been developed for grid forming (GFM) operation of VSCs utilizing the almost global asymptotic synchronization guarantee in nonlinear oscillator networks. The superior synchronization property of nonlinear oscillators has not been explored for grid following (GFL) operation. Despite the growing interest in GFM converters, GFL converters remain predominant and are essential for a class of applications such as point-of-load (POL) converters and active-front-end rectifiers.

A major constraint of oscillator based methods arises from the lack of fault ride-through capability. The capability to ride-through AC/grid faults with defined fault current contribution while operating within safe current limits allowable by the converter hardware is essential for stable operation and protection coordination in power electronics dominated electrical grids. However, no compatible fault ride-through strategy has been reported for oscillator based GFM controllers, which severely limits practical applications. Moreover, fault-handling in GFM converters, even in conventional droop based VSCs, remains an open research problem till date. In a PSC based converter, a backup PLL is run for fault management; during grid faults, the converter control system switches from PSC to PLL based current controlled operation [4]. In droop based GFM converters, over-current protection may be achieved by directly limiting the reference to the inner current control loop; but this causes wind-up in the outer droop control loops which eventually leads to a loss of synchronization and instability [15]. As an alternative, switching to PLL based grid-following operation during faults has been proposed in [16], [17], and dynamic virtual impedance control and adaptive droop control during faults were proposed in [18]. Fault ride-through becomes even more challenging under asymmetric AC faults. Under such conditions, a complex PLL structure, namely, decoupled double synchronous reference frame (DDSRF) PLL, is required to retain synchronization with the AC grid [19]. However, PLLs lead to sub-synchronous oscillations or even instability under weak grid conditions [4], [20]. No PLL-less grid synchronization method under asymmetric grid conditions has been reported for either GFL or GFM converters till date. Furthermore, a lack of robust synchronization capability under widely varying grid impedance conditions requires control parameter tuning under variable grid conditions, which increases the cost of development, deployment, and maintenance of grid tied power electronic converters.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
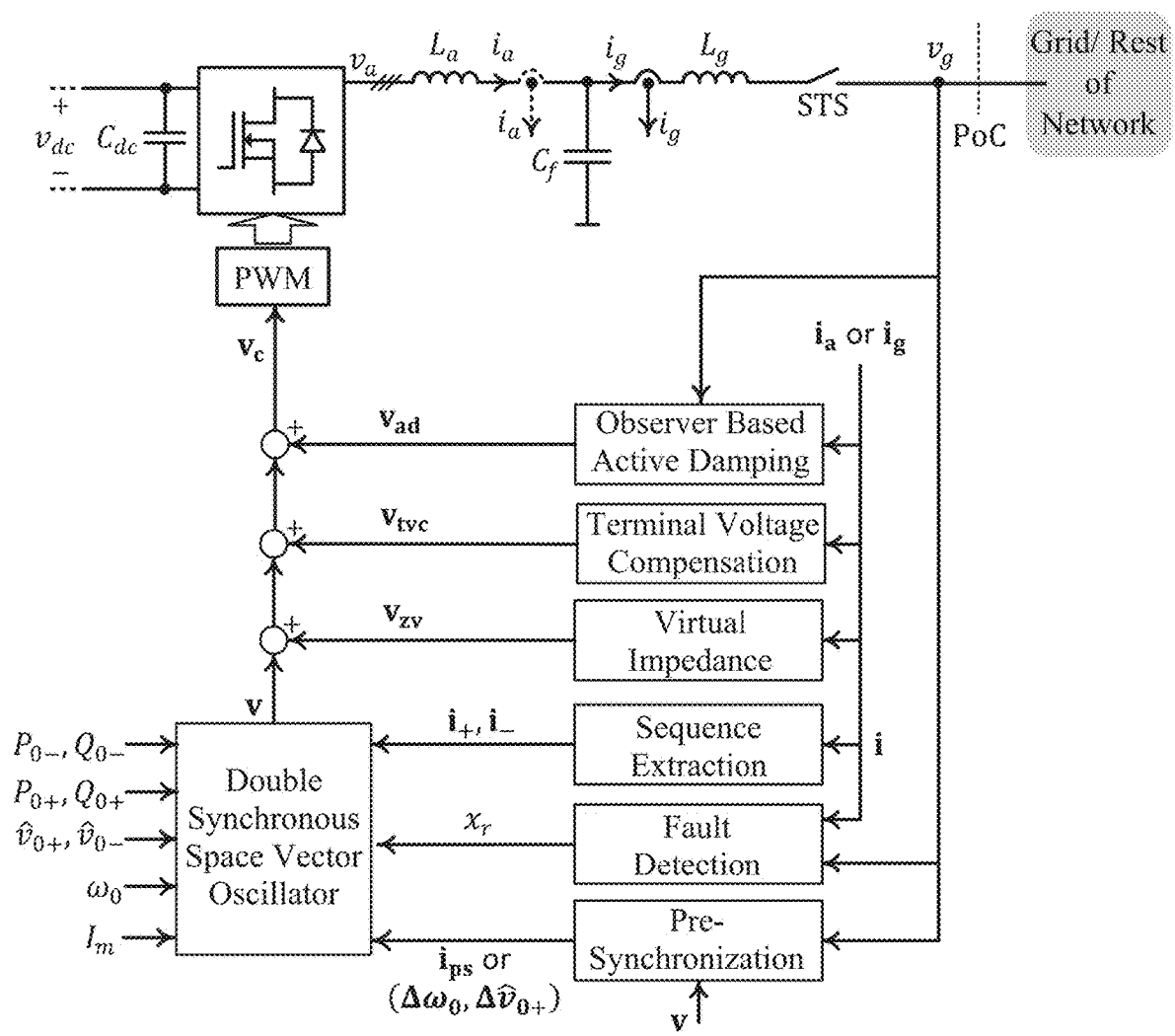
FIG. 1 shows a three-phase power electronic converter based on an exemplary double synchronous unified virtual oscillator controller (DSUVOC) using either the converter side current $i_a$ of the grid/network-side current $i_g$ feedback in accordance with embodiments of the present disclosure.

The present disclosure describes various embodiments of systems, apparatuses, and methods for a double synchronous unified virtual oscillator controller (DSUVOC) of a power electronic converter. In accordance with embodiments of the present disclosure, a double synchronous unified virtual oscillator controller (DSUVOC) enables phase-locked-loop (PLL)-less grid synchronization and ride-through in grid following and grid forming power electronic converters under nominal conditions as well as under both symmetric (balanced) and asymmetric (unbalanced) AC fault conditions.

In a grid following power electronic converter, an exemplary DSUVOC achieves grid connected operation with bidirectional power flow control and DC bus voltage regulation. Grid forming (GFM) operation is achieved in both grid connected and islanded modes with seamless transition between the two. For both GFL and GFM modes of operation, an exemplary DSUVOC enables fast over-current limiting and simultaneous synchronization to the positive and negative sequence symmetrical components of the AC network/grid voltage without any phase-locked-loop (PLL) circuitry. This enables ride-through of balanced/symmetrical and unbalanced/asymmetrical faults without the need for switching to a separate set of back-up controller under fault conditions. The PLL-ness nature of the DSUVOC enables robust synchronization of power electronic converters under widely varying grid strengths ranging from strong to ultra-weak grids using identical control parameters. The GFL and GFM operation, fault ride-through response, and robust operation under variable grid conditions of an exemplary DSUVOC are validated through hardware experiments in a hybrid AC-DC microgrid.

Space vector notations are used in subsequent analysis and descriptions of an exemplary DSUVOC controller. The space vector representation of a set of three-phase quantities, such as $[u_u\ u_v\ u_w]^T$, in the stationary $\alpha\beta$ reference frame is obtained using magnitude-invariant Clarke transformation. The corresponding space vector is denoted as $u=[u_\alpha\ u_\beta]^T \leftrightarrow u=u_\alpha+ju_\beta$, where $j=\sqrt{-1}$ denotes the imaginary unit. The column vector u and the complex representation u of space vectors are used interchangeably in the rest of the present disclosure. A subscript of '0', such as in $u_0$ or $u_o$, denote the reference/set-point or nominal value of the respective state/variable. Positive and negative sequence components correspond to the symmetrical components of a three-phase quantity. A '+' or '−' in the subscript represents the +ve or −ve sequence component of the corresponding variable; the +ve and −ve sequence components of u are denoted as $u_+=[u_{\alpha+}\ u_{\beta+}]^T \leftrightarrow u_+=u_{\alpha+}+ju_{\beta+}$ and $u_-=[u_{\alpha-}\ u_{\beta-}]^T \leftrightarrow u_-=u_{\alpha-}+ju_{\beta-}$. Similarly, the +ve and −ve sequence components of $u_0$ are denoted as $u_{0+}=[u_{\alpha 0+}\ u_{\beta 0+}]^T \leftrightarrow u_{0+}=u_{\alpha 0+}+ju_{\beta 0+}$ and $u_{0-}=[u_{\alpha 0-}\ u_{\beta 0-}]^T \leftrightarrow u_{0-}=u_{\alpha 0-}+ju_{\beta 0-}$. The magnitude of a vector is denoted as $\hat{(\cdot)}$, e.g., $\hat{u}=\|u\|=(u_\alpha^2+u_\beta^2)^{0.5}$.

A three-phase power electronic converter using DSUVOC is shown in FIG. 1. The DSUVOC controller is implemented based on space vectors in stationary $\alpha\beta$-reference frame. DSUVOC generates a voltage vector output $v_c$ using feedback of the terminal voltage $v_g$ at the point-of-coupling (PoC) (of the power electronic converter with the power grid) and the converter output current; either of the converter-side current $i_a$ or the network/grid-side current $i_g$ feedback can be used. The switching duty ratio m is generated for pulse-width modulation (PWM) using appropriate scaling based on the DC bus voltage measurement. The DSUVOC structure includes a double synchronous space vector oscillator component, a sequence extraction (SE) component, a fault detection (FD) component, a pre-synchronization (PS) component, a virtual impedance (VI) component, a terminal voltage compensation (TVC) component, and an active damping (AD) component. All components are not essential and selective components can be used in various applications for specific control objectives. The DSUVOC controller can be identically used in single phase and three-phase applications.

Figure 2:
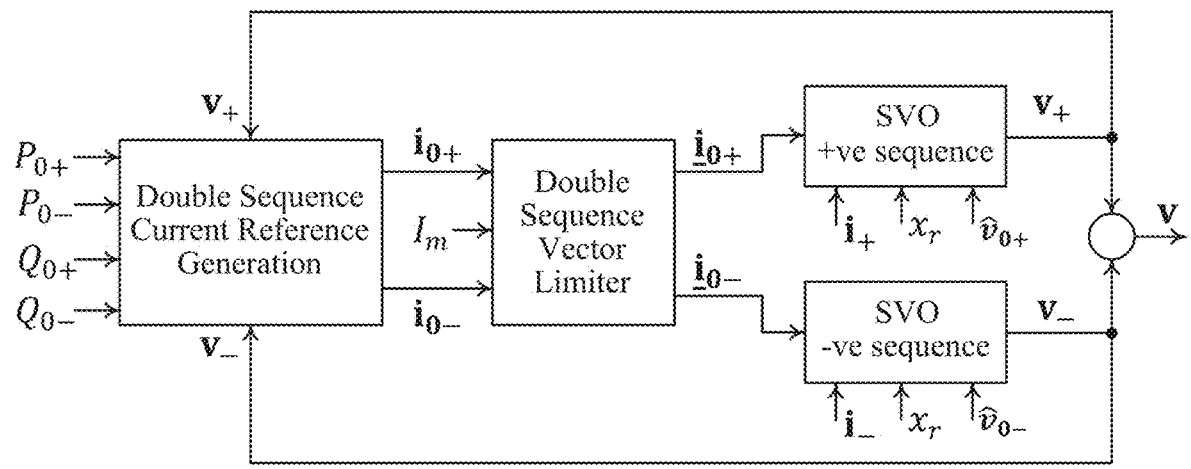
FIG. 2 shows a double synchronous space vector oscillator which enables simultaneous synchronization to both positive and negative sequence components of a grid voltage in accordance with embodiments of the present disclosure.

The double synchronous space vector oscillator component, shown in FIG. 2, includes four components: a double sequence current reference generation (DSCRG) component, a double sequence vector limiter (DSVL) component, a +ve sequence space vector oscillator (SVO), and a −ve sequence SVO. The DSCRG uses the +ve sequence real and reactive power set-points $(P_{0+}, Q_{0+})$, the −ve sequence real and reactive power set-points $(P_{0-}, Q_{0-})$, and the +ve and −ve sequence SVO outputs $v_+$ and $v_-$, respectively, to generate the +ve sequence current reference $i_{0+} \leftrightarrow [i_{\alpha 0+}\ i_{\beta 0+}]^T$ and the −ve sequence current reference $i_{0-} \leftrightarrow [i_{\alpha 0-}\ i_{\beta 0-}]^T$. Instead of separate +ve and −ve sequence power set-points, aggregate set-points $P_0=P_{0+}+P_{0-}$ and $Q_0=Q_{0+}+Q_{0-}$ may also be used. The double sequence current reference can be generated for different control objectives. For instance, under asymmetric grid faults, unbalanced/asymmetric reactive power injection may be desired to boost the positive sequence component and to reduce the negative sequence component of the grid voltage. Alternatively, constant real power flow may be desired under unbalanced fault condition to reduce the stress on the DC bus capacitor. For constant real power flow under unbalanced grid condition, the double sequence current references can be determined as:

$$i_{\alpha 0+} = \frac{2P_0 v_{\alpha+}}{N(|v_+|^2 - |v_-|^2)} + \frac{2Q_0 v_{\beta+}}{N(|v_+|^2 + |v_-|^2)} \quad \text{1(a)}$$

$$i_{\beta 0+} = \frac{2P_0 v_{\beta+}}{N(|v_+|^2 - |v_-|^2)} - \frac{2Q_0 v_{\alpha+}}{N(|v_+|^2 + |v_-|^2)} \quad \text{1(b)}$$

$$i_{\alpha 0-} = \frac{2P_0 v_{\alpha-}}{N(|v_+|^2 - |v_-|^2)} + \frac{2Q_0 v_{\beta-}}{N(|v_+|^2 + |v_-|^2)} \quad \text{1(c)}$$

$$i_{\beta 0-} = \frac{2P_0 v_{\beta-}}{N(|v_+|^2 - |v_-|^2)} - \frac{2Q_0 v_{\alpha-}}{N(|v_+|^2 + |v_-|^2)} \quad \text{1(d)}$$

Here, N=1 or N=3 is used for single-phase or three-phase applications, respectively. The choice of how the double sequence current reference is generated is not unique and different selection rules may be used to achieve various control objectives such as constant real power flow, constant reactive power flow, balanced three-phase current injection, etc. Note that under symmetric/balanced grid condition $v_-=0$ and hence a balanced three-phase current reference, i.e., $i_{0-}=0$, is obtained.

The double sequence vector limiter (DSVL) is used to limit the current reference below the maximum current value allowable for the power electronic converter hardware. For $i_{0+}\neq 0$, $i_{0-}\neq 0$, the two sequence vectors rotate in an opposite direction and lead to a resultant rotating vector in the stationary frame with a time-varying magnitude. Therefore, to ensure safe converter operation, the current references of all three phases must be checked and limited within safe values. In the DSVL, the three-phase current references $[i_{u0}, i_{v0}, i_{w0}]$ are determined as:

$$i_{u0}=[i_{\alpha 0+}^2+i_{\beta 0+}^2+i_{\alpha 0-}^2+2(i_{\alpha 0+}i_{\alpha 0-}-i_{\beta 0+}i_{\beta 0-})]^{1/2} \quad (2a)$$

$$i_{v0}=[i_{\alpha 0+}^2+i_{\beta 0+}^2+i_{\alpha 0-}^2+i_{\beta 0-}^2-(i_{\alpha 0+}i_{\alpha 0-}-i_{\beta 0+}i_{\beta 0-})-\sqrt{3}(i_{\beta 0+}i_{\alpha 0-}+i_{\alpha 0+}i_{\beta 0-})]^{1/2} \quad (2b)$$

$$i_{w0}=[i_{\alpha 0+}^2+i_{\beta 0+}^2+i_{\alpha 0-}^2+i_{\beta 0-}^2-(i_{\alpha 0+}i_{\alpha 0-}-i_{\beta 0+}i_{\beta 0-})]^{1/2}. \quad (2c)$$

Next, the instantaneous maximum phase current reference is determined as $i_{0max}=\max\{i_{u0}, i_{v0}, i_{w0}\}$. The saturated current reference vectors are then obtained as $$\underline{i}_{0+}=k_{sat}i_{0+};\ \underline{i}_{0-}=k_{sat}i_{0-} \quad (3)$$

Here, $k_{sat}=i_m/i_{0max}$ where $i_m$ denotes the maximum current allowable by the converter hardware.

Figure 3:
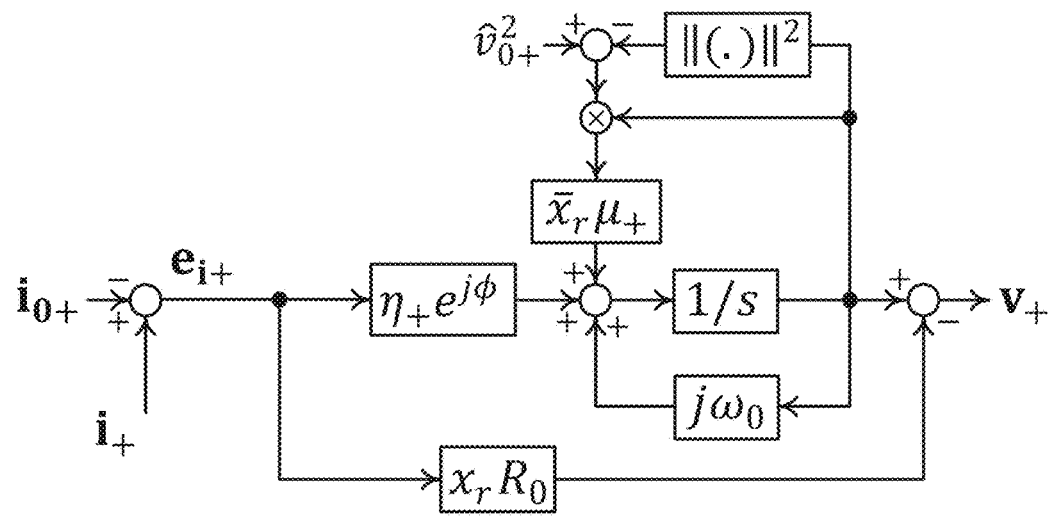
FIG. 3 shows an exemplary positive sequence space vector oscillator using error in square of voltage vector magnitude for magnitude correction in accordance with embodiments of the present disclosure.
Figure 4:
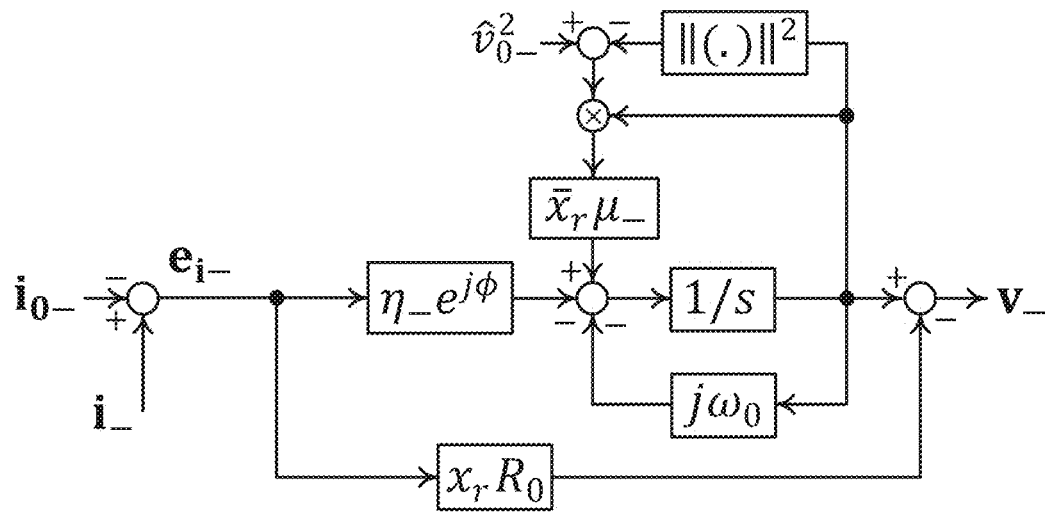
FIG. 4 shows an exemplary negative sequence space vector oscillator using error in square of voltage vector magnitude for magnitude correction in accordance with embodiments of the present disclosure.

The positive and negative sequence space vector oscillators (SVO) serve as the synchronizing units for positive and negative sequence components, respectively. The implementation structure of the +ve and −ve sequence SVOs are shown in FIG. 3 and FIG. 4, respectively. The dynamics of the +ve and −ve sequence SVOs are given as $$\dot{v}_+=j\omega_0+\bar{x}_r\mu_+(\hat{v}_{0+}^2-\|v_+\|^2)+\eta_+e^{j\phi}(\underline{i}_{0+}-i_+) \quad (4a)$$

$$\dot{v}_-=-j\omega_0+\bar{x}_r\mu_-(\hat{v}_{0-}^2-\|v_-\|^2)-\eta_-e^{j\phi}(\underline{i}_{0-}-i_-) \quad (4b)$$

Here, $\omega_0$ denotes the nominal frequency; $\hat{v}_{0+}$ and $\hat{v}_{0-}$ denote the peak values of the +ve sequence and −ve sequence voltage references $v_{0+}$ and $v_{0-}$, respectively; $\eta_+>0$ and $\eta_->0$ are the synchronization gains; $\mu_+>0$ and $\mu_->0$ are the voltage magnitude correction gains; and $\phi\in[0,\pi/2]$ is chosen for desired droop relation. For instance, $\phi=\pi/2$ gives a real power versus frequency and reactive power versus voltage droop response, whereas $\phi=0$ leads to the opposite droop relation. To facilitate a smooth and seamless transition between normal operations and a fault ride-through operation, the SVO dynamics are adjusted through a mode transition signal $x_r$ generated by the fault detection (FD) block (see FIG. 1). The complementary signal $\bar{x}_r=1-x_r$ is used in Equation (4a) and Equation (4b). The +ve and −ve sequence components, $i_+$ and $i_-$, respectively, of the converter output current are generated by the sequence extraction (SE) block in FIG. 1. Under normal operation, the negative sequence SVO may be disabled; however, both +ve and −ve sequence SVOs are required under unbalanced grid conditions. An active resistance $R_0$ is used (see FIG. 3 and FIG. 4) to achieve fast over-current limiting under fault conditions. The insertion and exclusion of the active resistance under different modes of operation are achieved through the mode transition signal $x_r$. To reduce current tracking error under fault conditions, the synchronization gains $\eta_+$ and $\eta_-$ are raised to higher values as:

$$\eta_+ = \eta_{0+}\left(1 + \frac{x_r}{\tau_f}\right) \quad (5a)$$

$$\eta_- = \eta_{0-}\left(1 + \frac{x_r}{\tau_f}\right) \quad (5b)$$

where $\eta_{0+}$ and $\eta_{0-}$ are the nominal synchronization gains and $\tau_f$ denotes the settling time.

Another alternative implementation of the space vector oscillators can be represented as:

$$\dot{v}_+ = j\omega_0 + \bar{x}_r\mu_+(\hat{v}_{0+}-\|v_+\|)+\eta_+ e^{j\phi}(\underline{i}_{0+}-\underline{i}_+) \quad (6a)$$

$$\dot{v}_- = -j\omega_0 + \bar{x}_r\mu_-(\hat{v}_{0-}-\|v_-\|)-\eta_- e^{j\phi}(\underline{i}_{0-}-\underline{i}_-) \quad (6b)$$

In Equation (4a) and (4b), the error in the squares of the voltage vector magnitudes $(\hat{v}_{0+}^2-\|v_+\|^2)$ and $(\hat{v}_{0-}^2-\|v_-\|^2)$ are used in the magnitude correction terms, respectively, whereas in Equation (6a) and (6b), errors in the voltage vector magnitudes $(\hat{v}_{0+}-\|v_+\|)$ and $(\hat{v}_{0-}-\|v_-\|)$ are used, respectively. For brevity, in the following texts the analysis and design are shown using Equation (4a) and (4b). Similar analysis, design, and controller implementation can be achieved using Equation 6(a) and 6(b) as well.

From the converter output current $i \leftrightarrow [i_\alpha \quad i_\beta]^T$, the sequence extraction (SE) block calculates the +ve and −ve sequence components $i_+ \leftrightarrow [i_{\alpha+} \quad i_{\beta+}]^T$ and $i_- \leftrightarrow [i_{\alpha-} \quad i_{\beta-}]^T$ as:

$$i_{\alpha+}=0.5(i_\alpha-i_{\beta\perp}) \quad (7a)$$

$$i_{\beta+}=0.5(i_\beta+i_{\alpha\perp}) \quad (7b)$$

$$i_{\alpha-}=0.5(i_\alpha+i_{\beta\perp}) \quad (7c)$$

$$i_{\beta-}=0.5(i_\beta-i_{\alpha\perp}) \quad (7d)$$

where $i_{\alpha\perp}$ and $i_{\beta\perp}$ denote the $T_0/4$ delayed versions of $i_\alpha$ and $i_\beta$, respectively, and $T_0=2\pi/\omega$.

Figure 5:
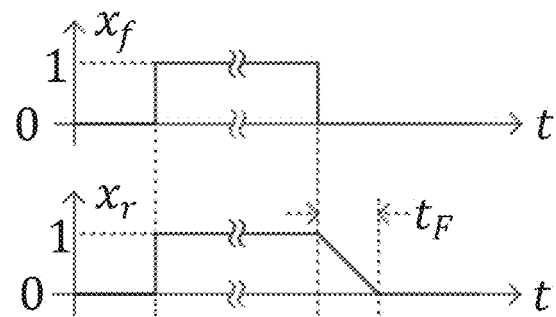
FIG. 5 shows generation of mode transition signal from a fault signal by an exemplary fault detection component in accordance with embodiments of the present disclosure.

The fault detection (FD) subsystem may detect and latch a fault state due to overcurrent, i.e., $\max\{i_u, i_v, i_w\}>I_m$, or due to unbalance in the grid voltage, i.e., $$\frac{\|v_{g-}\|}{\|v_{g+}\|} > k_{uft},$$

where $k_{uft}$ denotes the maximum allowable unbalance factor. The unbalance factor is defined as the ratio of the −ve sequence component $v_{g-}$ to the +ve sequence component $v_{g+}$ of the grid voltage $v_g$. The fault signal $x_f$ is shown in FIG. 5. Based on the fault signal $x_f$, the mode transition signal $x_r$ is generated. At the instant when a fault is detected and latched, i.e., $x_f=1$, $x_r$ follows $x_f$ immediately. However, when the fault is cleared, the transition signal is ramped down over a period of time $t_f$ to enable a smooth transition from a fault mode to a normal mode of operation.

Under the normal mode of operation, $x_r=0$ and the negative sequence SVO can be disabled. For ease of explanation of the synchronizing mechanism of the SVO, the normal operation is considered. Substituting Equation (1) into Equation (4a), the instantaneous voltage and frequency of the SVO output voltage are derived as:

$$\dot{V} = 2\mu(V_0^2 - V^2) + \frac{\eta}{NV}[(P_0-P)\cos\phi + (Q_0-Q)\sin\phi] \quad (8a)$$

$$\omega = \omega_0 + \frac{\eta}{NV^2}[(P_0-P)\sin\phi - (Q_0-Q)\cos\phi] \quad (8b)$$

where $$V = \frac{\|v\|}{\sqrt{2}}, \quad V_0 = \frac{\|v_0\|}{\sqrt{2}}, \quad P_0 = P_{0+},$$

$$Q_0 = Q_{0-}, \quad \eta = \eta_{0+}, \text{ and } \mu = \mu_+.$$

For $\phi = \frac{\pi}{2}$,

Equation (8) reduces to:

$$\dot{V} = 2\mu(V_0^2 - V^2) + \frac{\eta}{NV}(Q_0-Q) \quad (9a)$$

$$\omega = \omega_0 + \frac{\eta}{NV^2}(P_0-P) \quad (9b)$$

Figure 6:
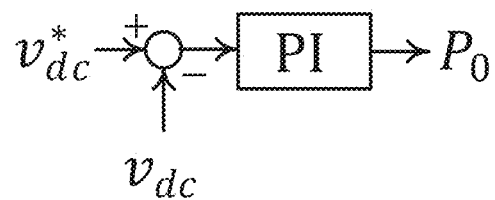
FIG. 6 shows an exemplary closed-loop compensator for DC bus voltage regulation in a grid following application using an exemplary DSUVOC in accordance with embodiments of the present disclosure.

For $\mu=0$, $Q=Q_0$ is achieved. For GFL operation, $\mu=0$ is used. Therefore, accurate tracking of the reactive power reference is achieved. However, a real power droop response is observed for any deviation of the grid frequency from the nominal value, i.e., $\omega\neq\omega_0$. Integral compensation can be used to achieve accurate tracking of a real power reference. For $\phi=0$ and $\mu=0$, accurate tracking of the real power reference is achieved by the SVO dynamics, but integral compensation is required to obtain accurate tracking of the reactive power reference. For DC bus voltage regulation in a GFL application, $\phi=\pi/2$ and $\mu=0$ can be used where the real power set-point $P_0$ is dynamically generated by applying a closed-loop compensator, such as a proportional-integral (PI) compensator, on the DC bus voltage error, which is shown in FIG. 6, where $v_{dc}^*$ denotes the DC bus voltage reference.

For GFM operation $\mu\neq0$ is used. For $\mu\neq0$ and $\phi=\pi/2$, the voltage magnitude and frequency can be derived from Equation (9) as:

$$V^2 = V_0^2 + \frac{\eta}{2\mu N V^2}(Q_0 - Q) \quad (10a)$$

$$\omega = \omega_0 + \frac{\eta}{NV^2}(P_0 - P) \quad (10b)$$

Accordingly, a real power versus frequency and reactive power versus voltage droop responses are obtained. For $\phi=0$, opposite droop relations are obtained as:

$$V^2 = V_0^2 + \frac{\eta}{2\mu N V^2}(P_0 - P) \quad (11a)$$

$$\omega = \omega_0 + \frac{\eta}{NV^2}(Q_0 - Q) \quad (11b)$$

In Equation (10a) and (11a), the droop response is obtained in terms of the square of the voltage vector magnitude due to SVO implementation following Equation (4a) and (4b). The droop response in terms of voltage vector magnitude, instead of its square, can be obtained with an SVO implementation following Equation (6a) and (6b).

There are two key purposes of virtual impedance, namely, harmonic compensation and the stabilization of SVOs. Non-ideal effects, such as dead-time, introduce harmonic distortion in $v_a$. Moreover, harmonic distortion in the network/grid voltage $v_g$ or nonlinear loads lead to undesired harmonic distortion in the output current. Contrarily, in certain applications, specifically in an islanded microgrid, harmonic current injection by the GFM converters may be desired to compensate for harmonic distortion in the network voltage. The converter output impedance or admittance can be selectively increased to very high values at the harmonic frequencies to achieve the desired harmonic compensation in converter output current or network voltage, respectively. In a power electronic converter, harmonic current suppression is achieved by virtual impedance as:

$$v_{zv}(s) = v_x - Z_v(s) \times i_x(s); \ \forall x \in \{\alpha, \beta\} \quad (12a)$$

$$Z_v(s) = \frac{R_{vir} + sL_{vir}}{\frac{s}{\omega_c} + 1} + \sum_h -\frac{K_h \omega_{B,h} \omega_h}{s^2 + \omega_{B,h} s + \omega_h^2}; \text{ or} \quad (12b)$$

$$Z_v(s) = \frac{R_{vir} + sL_{vir}}{\frac{s}{\omega_c} + 1} + \sum_h \frac{K_h \omega_{B,h} s}{s^2 + \omega_{B,h} s + \omega_h^2} \quad (12c)$$

Here, $K_h$ and $\omega_{B,h}$ denote the desired impedance magnitude and the bandwidth of the resonant filter at harmonic frequency $\omega_h$, respectively. On the other hand, virtual resistance $R_{vir}$ emulation is necessary to ensure dynamic stability of the SVOs. A virtual inductance $L_{vir}$ may also be used in different applications where very fast over-current limiting is required under fault operation with a strong grid condition. A limited bandwidth of $\omega_c$ in Equation (7) is used for the virtual resistance and inductance emulation. Further detail and design guidelines for $Z_v(s)$ can be found in a paper by Awal, et al. (M. A. Awal, H. Yu, I. Husain, W. Yu, and S. Lukic, "Selective Harmonic Current Rejection for Virtual Oscillator Controlled Grid-Forming Voltage Source Converters," in *IEEE Transactions on Power Electronics*) [21].

In existing literature, the high frequency dynamics of the higher order input filters, such as LCL filters, of oscillator based VSCs have been completely ignored which may lead to undesired resonances in the high frequency range (hundreds of Hz to few kHz). The digital controller implementation delay and variation in network/grid impedance further aggravates the severity of such resonances and may even destabilize the system in extreme cases. In various embodiments, an exemplary DSUVOC includes an observer band active damping (OBAD) component that utilizes an observer to estimate the states of the LCL filter, and using the observer estimated states, active damping of the of high frequency resonances is achieved [22].

For the analysis and design of the observer based active damping, the slower dynamics of the SVOs and the selectively tuned dynamics of virtual impedance emulation can be ignored. The LCL filter is modelled as:

$$\frac{d}{dt}(x) = Ax + Bu; \ x = [i_a i_g v_f]^T; \ u = [v_a v_g]^T \quad (13)$$

The system matrices A and B can be determined using the LCL filter parameters. A discrete observer is designed using the LCL filter model, in which the discrete observer is implemented as:

$$\hat{x}[k+1] = A_{obs}\hat{x}[k] + B_{obs}u_{obs}[k]; \hat{x} = [\hat{i}_a \hat{i}_g \hat{v}_f]^T; \ u_{obs} = [v_a \text{-} v_g i_m]^T \quad (14)$$

where $i_m = i_a$ or $i_m = i_g$ can be used based on availability of feedback signal. The output of the OBAD block is calculated as $v_{ad} = R_{ad}(\hat{i}_a - \hat{i}_g)$, where $R_{ad}$ denotes the active damping gain.

The power electronic converter can connect/disconnect to/from the network using a static-transfer-switch (STS). This process of synchronizing the converter output voltage with the grid voltage is termed as pre-synchronization. The pre-synchronization can be achieved by a first-order low-pass filter in the form of a virtual RL branch. A virtual current $i_{ps}$ can be generated by the pre-synchronization block to estimate the current that would flow if the STS were closed. The virtual current is generated as:

$$i_{ps} = \frac{v - v_g}{sL_{ps} + R_{ps}} \quad (15)$$

The parameters can be chosen as $L_{ps} \approx (L_a + L_g)$ and $R_{ps} \approx R_{vir}$. It is worth noting that exact knowledge of the LCL filter parameters are not required for the parameter selection. To illustrate the functionality, two distinct use-cases can be defined for the pre-synchronization component.

For GFM converters while serving local loads, the voltages across the STS need to be synchronized prior to closing the STS. In such scenarios, the virtual current $i_{ps}$ is added to the actual converter output current and the resultant total current is used as feedback to the SVOs. The virtual current $i_{ps}$ gives an estimate of the current that would flow between the power electronic converter and the network at the PoC if the STS were closed. Due to the virtual current $i_{ps}$ feedback, SVOs adjust the oscillator voltage to minimize the virtual real and reactive power flow. When the amplitude of the virtual current $|i_{ps}|$ stabilizes, the STS can be closed safely.

For GFL operation, the STS can be closed before the switching of the power devices are initiated. For instance, during start-up of an active-front-end rectifier, the DC bus may be charged by using the switch network as an uncontrolled diode bridge. Meanwhile, the SVOs can be synchronized with the measured voltage $v_g$ using the pre-synchronization filter. Once $|i_{ps}|$ stabilizes, the DC bus voltage control loop and the switching of the power devices can be initialized without large transients. Alternatively, PLL based pre-synchronization may also be used where PLLs are run to detect the phase and voltage magnitude mismatches between the converter output voltage and the grid voltage. Two sets of PI compensators can be used on the differences, and dynamic adjustments $\Delta V_0$ and $\Delta \omega_0$ are generated which are added to the nominal voltage and frequency set-points. Note that these PLLs are not required for grid synchronization when the power electronic converter is connected to the electrical network/grid; rather, the double synchronous space vector oscillator serves as the synchronizing units.

The droop responses given by Equations (8), (9), (10), and (11) appear at the converter's switch terminals and not at the PoC. The LCL filter causes voltage deviation from the ideal droop response depending on the power flow between the converter and the grid. The terminal voltage compensation (TVC) (see FIG. 1) is used to compensate such voltage deviations. The TVC is implemented as:

$$v_{tvc} = j\omega_0(L_a + L_g)i \quad (16)$$

In various embodiments, DSUVOC is a vector controller running on both $\alpha$ and $\beta$ axis. In a single-phase implementation, a full vector controller is used. The feedback signal $i_\beta$ can be generated by delaying the actual converter output current $i_\alpha = i_g$ or $i_a$ by $T_0/4 = 2\pi/(4\omega_0)$, where $\omega_0$ denotes the nominal frequency of the power electronic converter and the modulating signal for PWM is obtained from $v_{c\alpha}$. All analysis and design guidelines presented in the present disclosure are generalized to apply identically for single phase and three phase applications using a parameter N denoting the number of phases, i.e., N=1 and N=3 for single and three phase systems, respectively.

The GFL and GFM modes of operation of the DSUVOC are validated through hardware experiments using laboratory prototypes. For digital implementation, the SVO dynamic equations are discretized using Huen's method, which is a second order Runge-Kutta technique [23].

Figure 7A:
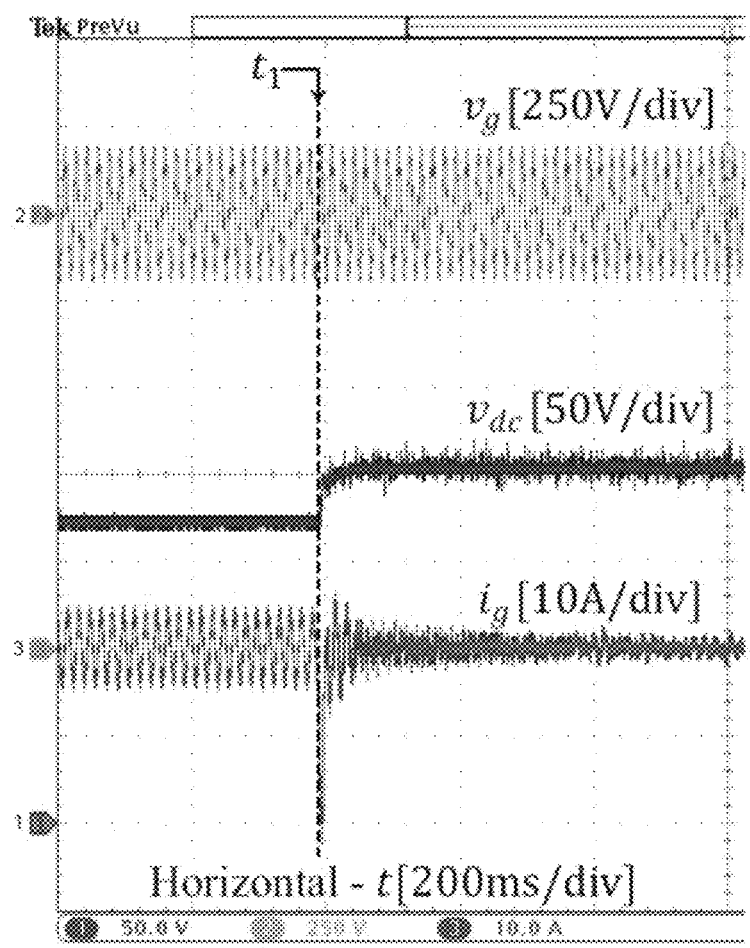
FIGS. 7A and 7B show a DC bus voltage regulation using a grid following (GFL) form of DSUVOC at (A) start-up transient and (B) steady-state voltage and current shapes in accordance with embodiments of the present disclosure.

In various embodiments, a single-phase active rectifier is used to validate the GFL operation, which has real and reactive powers ratings of $P_{rated}$=3 kW and $Q_{rated}$=1.5 kVAR, respectively. Accordingly, experiments are done for single phase systems, and hence, the negative sequence SVO is disabled. The subscript '+' is dropped from all parameters for simplicity, and the nominal DC bus voltage is set as $v_{dc}^*$=200 V. FIG. 7A shows the start-up transient, in which the DC voltage regulation is achieved using the DSUVOC without any power source on the DC bus side. Prior to start-up, the DC bus needs to be charged. By closing the STS, the DC bus is charged by operating the switch network as an uncontrolled diode-rectifier. Using the pre-synchronization block, SVO is synchronized with the voltage measured at the PoC. Note that $i_g$ measurement is excluded from the feedback to SVO during this time. Once $\|i_{ps}\|$ stabilizes, the DC bus voltage regulator and the converter switching is initiated at $t_1$. The DC bus voltage is quickly stabilized at the reference value.

Figure 7B:
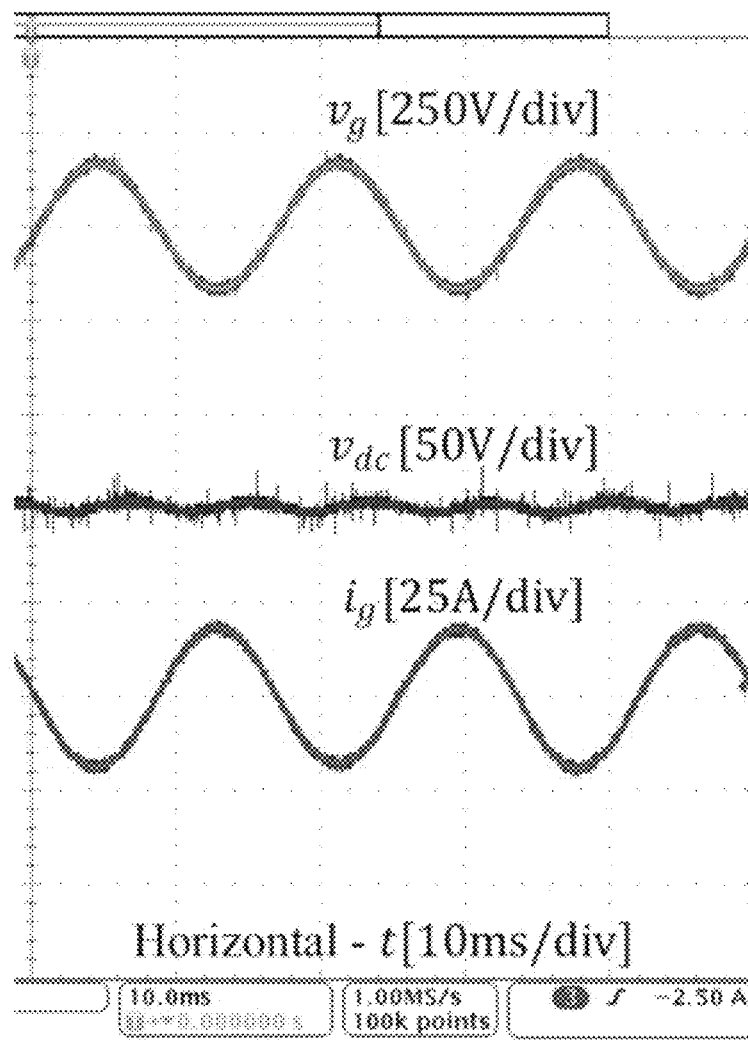
Figure 8A:
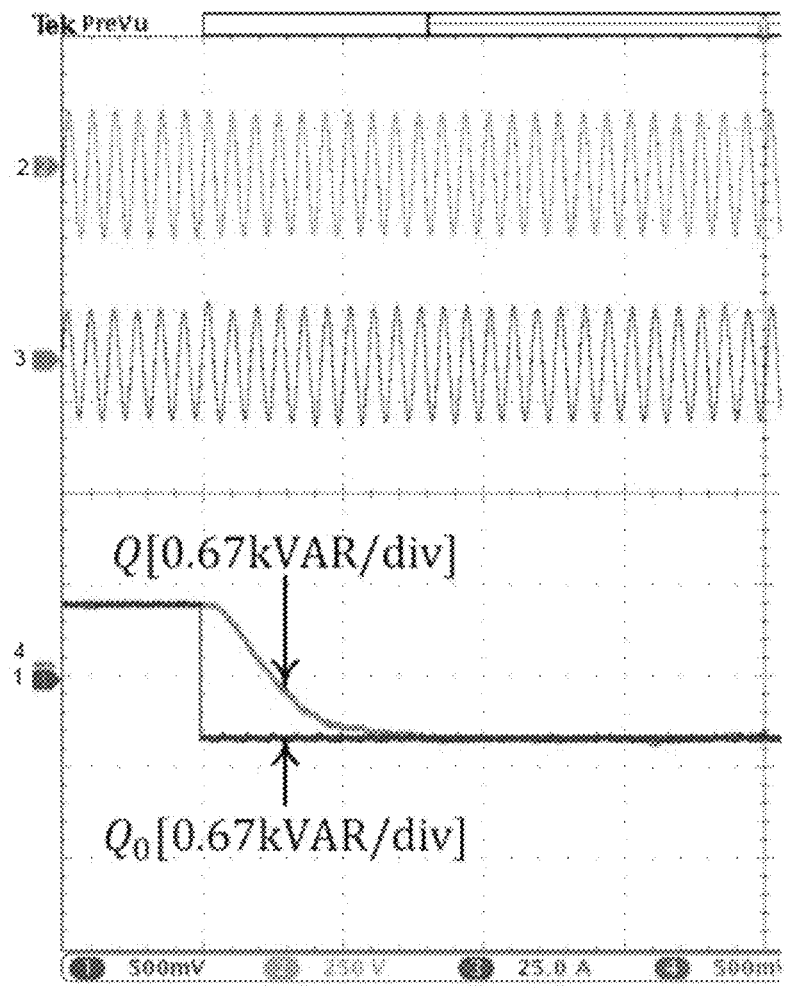
FIGS. 8A and 8B shows a response to step change in reactive power reference at (A) $Q_0$=500 VAR to $Q_0$=−500 VAR and (B) $Q_0$=−500 VAR to $Q_0$=500 VAR.
Figure 8B:
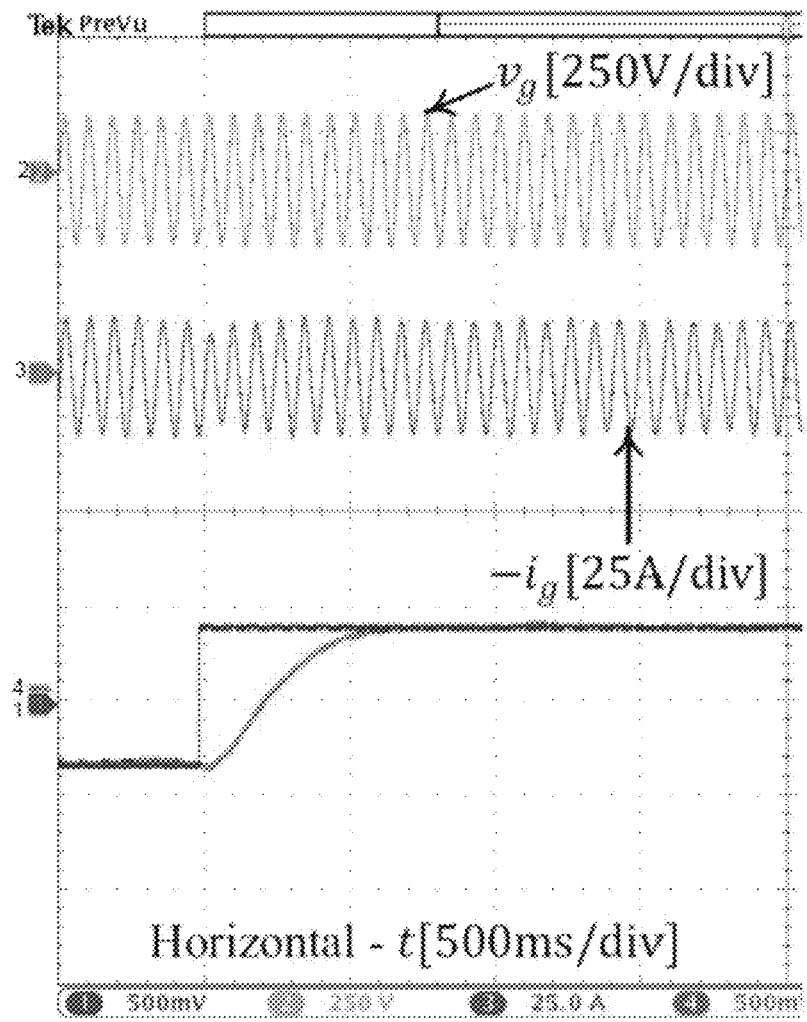
Figure 9A:
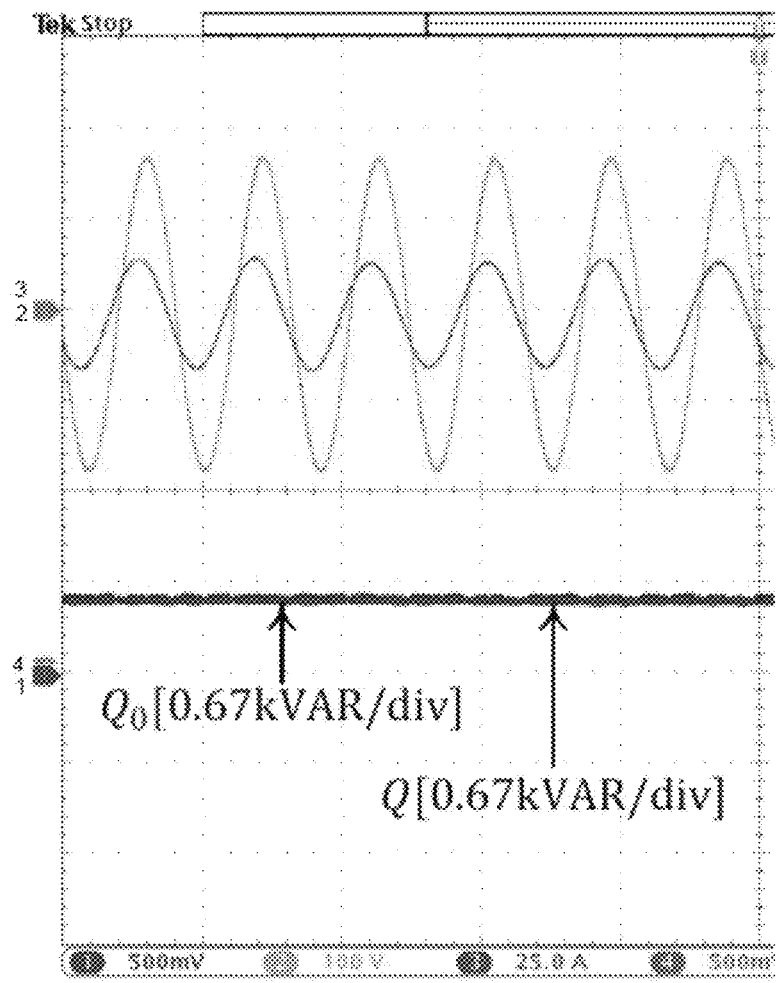
FIGS. 9A and 9B show a steady-state wave-shapes for (A) $Q_0$=500 VAR and (B) $Q_0$=−500 VAR.
Figure 9B:
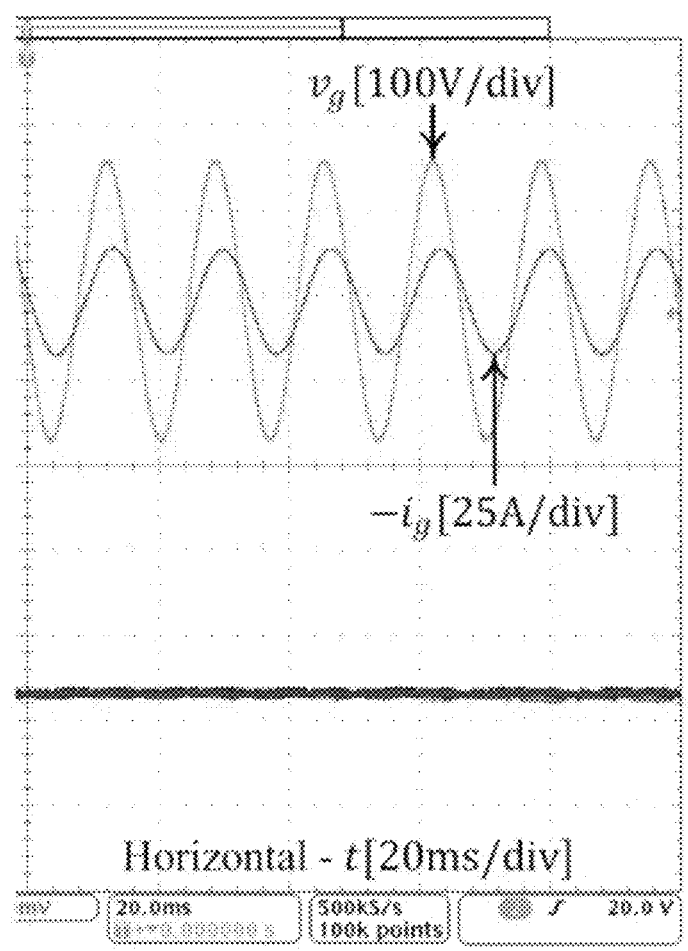

Next, FIG. 7B shows the steady-state voltage and current shapes when serving 1.5 kW load and the reactive power reference is set as $Q_0$=0. Next, reactive power dispatch is introduced, such that when a step change in the reactive power reference ($Q_0$=500 VAR to $Q_0$=-500 VAR) is introduced, the rectifier serves 1.2 kW DC load. The corresponding waveshapes are shown in FIG. 8A, where the reactive power reference $Q_0$ and the output reactive power Q measured by the digital controller are shown on the scope. The opposite step response for $Q_0$=500 VAR to $Q_0$=-500 VAR is shown in FIG. 8B. In both cases, accurate tracking of the reactive power reference is obtained with a minimal transient. The steady-state voltage and current shapes for $Q_0$=500 VAR and $Q_0$=-500 VAR are shown in FIG. 9A and FIG. 9B, respectively.

Figure 10:
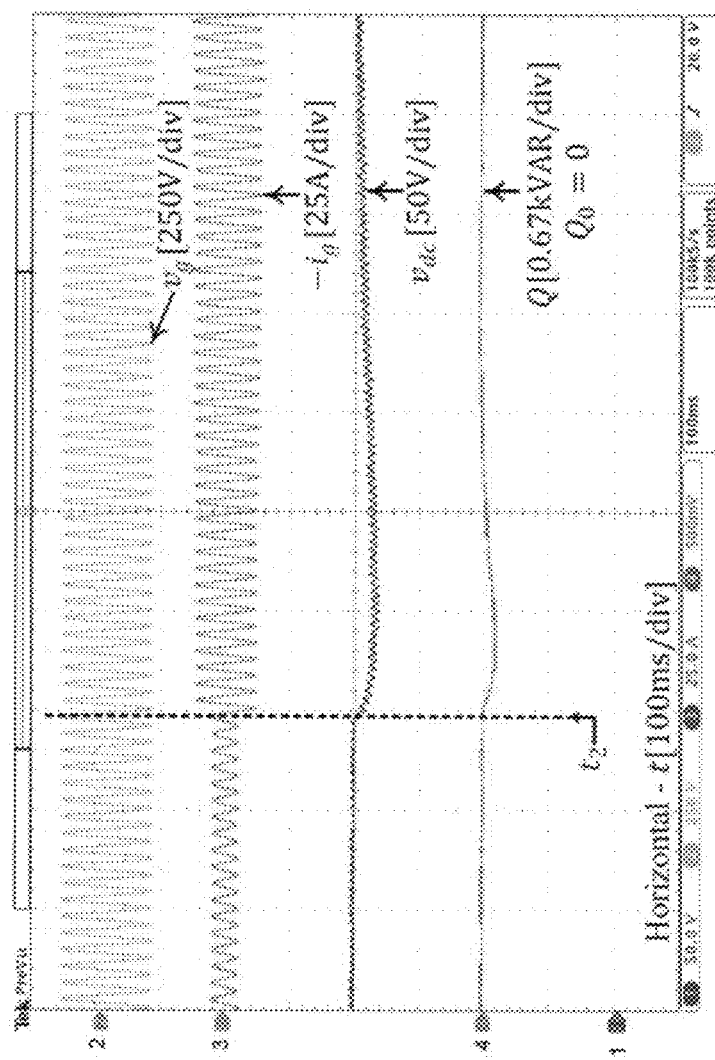
FIG. 10 shows a response to step change in a DC load in a GFL power electronic converter using an exemplary DSUVOC in accordance with embodiments of the present disclosure.

A step change in the DC load is introduced from 0.5 kW to 1.2 kW at $t=t_2$ while the reactive power reference is kept at $Q_0$=0 and the corresponding response is shown in FIG. 10. The DC bus voltage recovers quickly and the reactive power output settles back to the reference value after a small transient.

Figure 11:
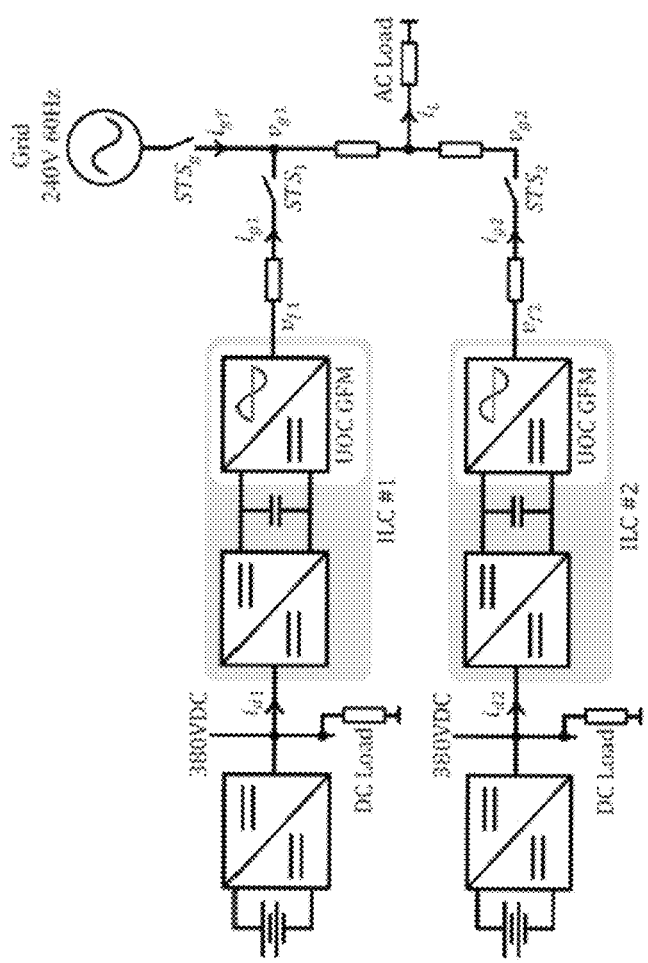
FIG. 11 shows a hybrid AC-DC microgrid setup in accordance with embodiments of the present disclosure.

DSUVOC GFM operation is validated in a hybrid AC-DC microgrid, and the microgrid structure is shown in FIG. 11. Two battery storage units are connected to 380V DC buses through non-isolated DC/DC converters, and two interlinking converters (ILCs) are used to connect the DC systems to the AC side. Each ILC can connect/disconnect to/from the AC microgrid using static transfer switches ($STS_1$ and $STS_2$) and the AC microgrid can be islanded using another $STS_g$. The front-ends of the ILCs are rated at $P_{rated}$=3 kW, and $Q_{rated}$=1.5 kVAR. The DSUVOC parameters $\eta$ and $\mu$ are selected using the guidelines listed in Table I (below) for $\phi$=0 and a virtual resistance of $R_{vir}$=0.2Ω is used.

TABLE I

| Parameter | For $\phi = \pi/2$ | For $\phi = 0$ |
|---|---|---|
| $\eta$ | $\dfrac{N\Delta\omega_{max}V_{max}^2}{P_{rated}}$ | $\dfrac{N\Delta\omega_{max}V_{max}^2}{Q_{rated}}$ |
| $\mu$ | $\dfrac{2\eta Q_{rated}}{N[(2V_{max}^2 - V_0^2)^2 - V_0^4]}$ | $\dfrac{2\eta P_{rated}}{N[(2V_{max}^2 - V_0^2)^2 - V_0^4]}$ |

Figure 12A:
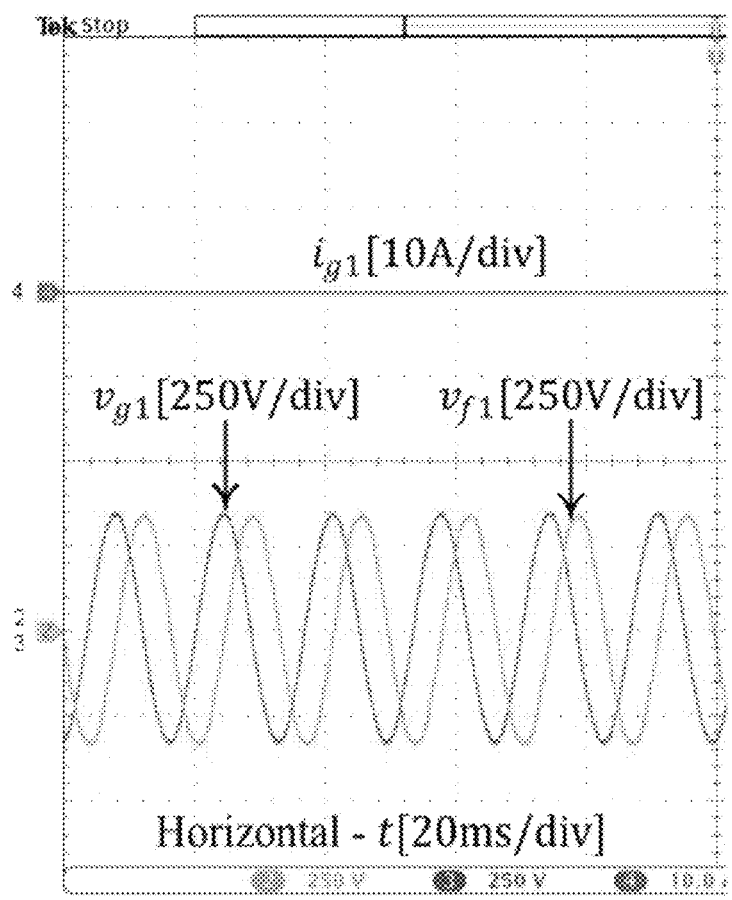
FIGS. 12A-12B show a pre-synchronization of an interlinking converter (ILC1) when a first static-transfer-switch ($STS_1$) is open and a second static-transfer-switch ($STS_g$) is closed (A) before synchronization and (B) at a synchronized condition in accordance with embodiments of the present disclosure.
Figure 12B:
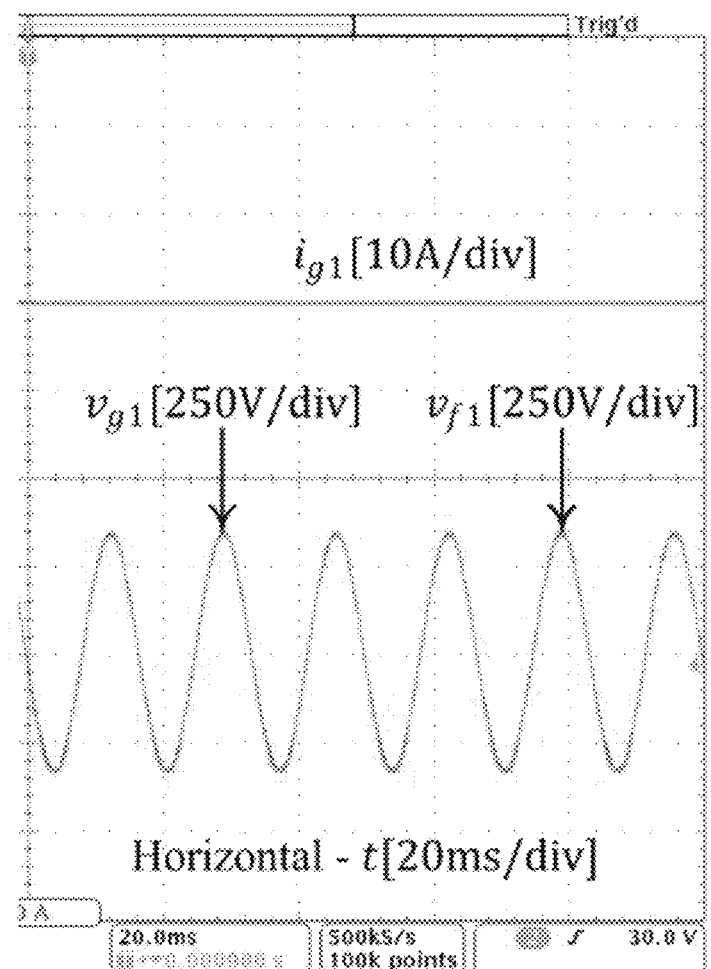
Figure 13:
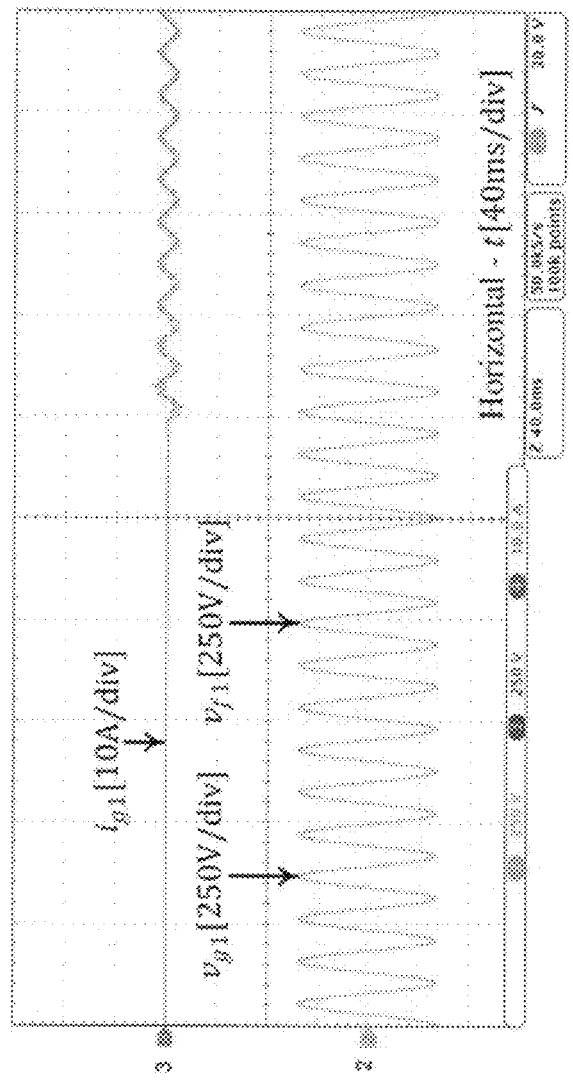
FIG. 13 shows an interlinking converter (ILC1) being connected to the grid by closing $STS_1$ after synchronization is achieved in accordance with embodiments of the present disclosure.

FIGS. 12A-12B show the pre-synchronization process for ILC1, when $STS_g$ is closed and $STS_1$ is open. Before synchronization, a large phase mismatch is observed between $\upsilon_{f1}$ and $\upsilon_{g1}$ (FIG. 12A). Using an exemplary pre-synchronization method, synchronization is achieved, as shown in FIG. 12B. At this condition, ILC1 can be connected to the grid by closing $STS_1$. The corresponding transient is shown in FIG. 13.

Figure 14A:
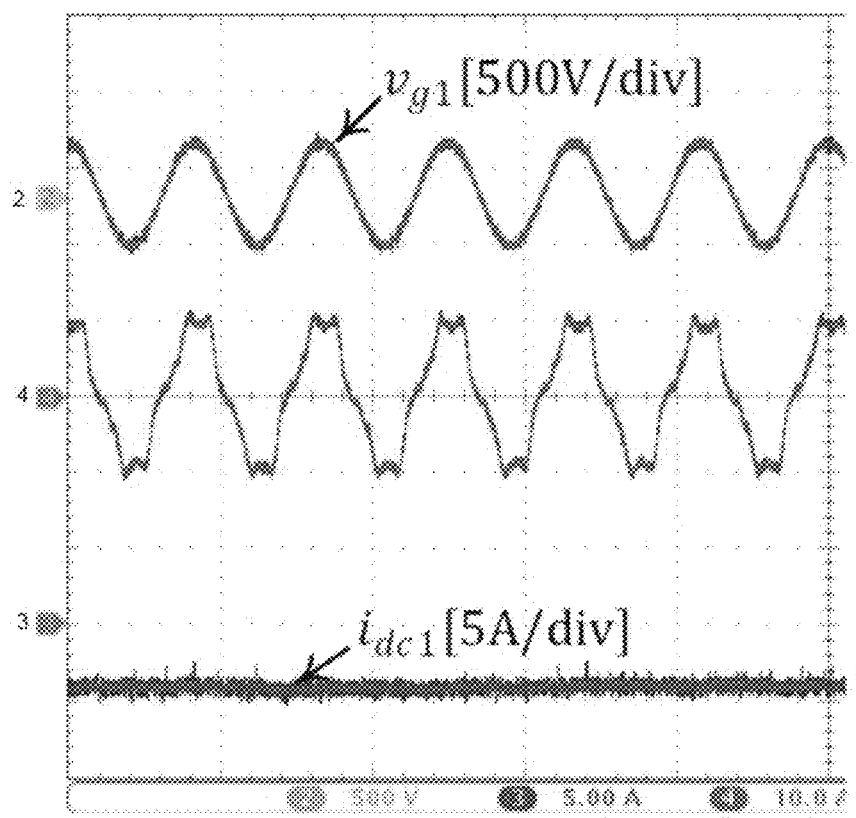
FIGS. 14A-14B show a harmonic compensation in converter output current (A) without harmonic suppression filters and (B) with harmonic compensation in accordance with embodiments of the present disclosure.
Figure 14B:
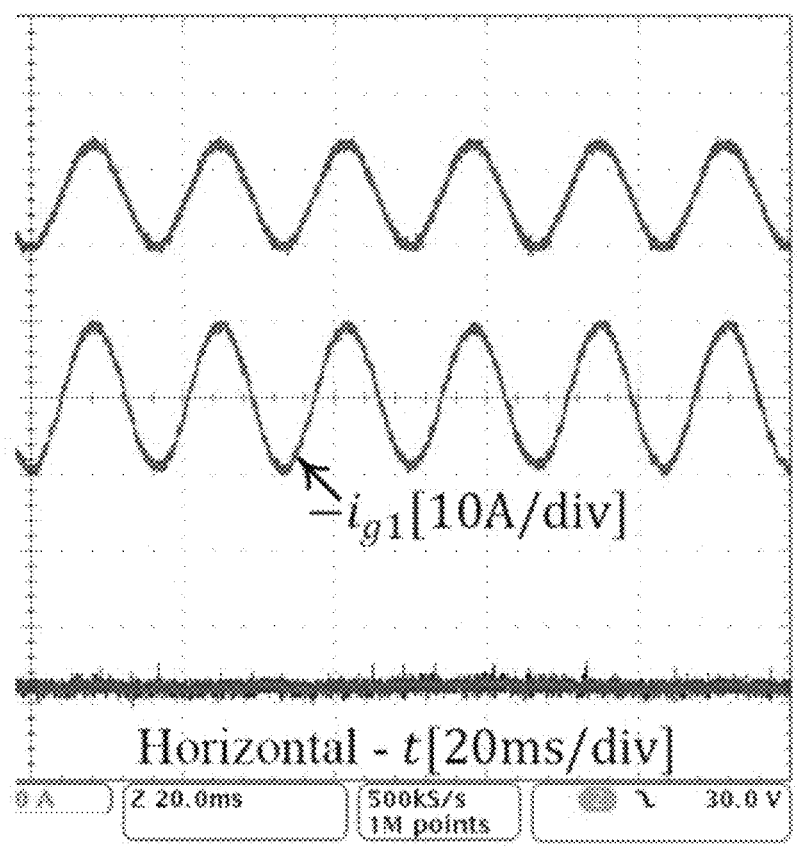

The converter output current without using the harmonic compensation method is illustrated in FIG. 14A, in which higher order harmonics are present in the output current. Using resonant filters given in Equation (12b) at h=3, 5, 7, 9, 11, and 13, the distortion is compensated and the corresponding current shape is shown in FIG. 14B.

Figure 15:
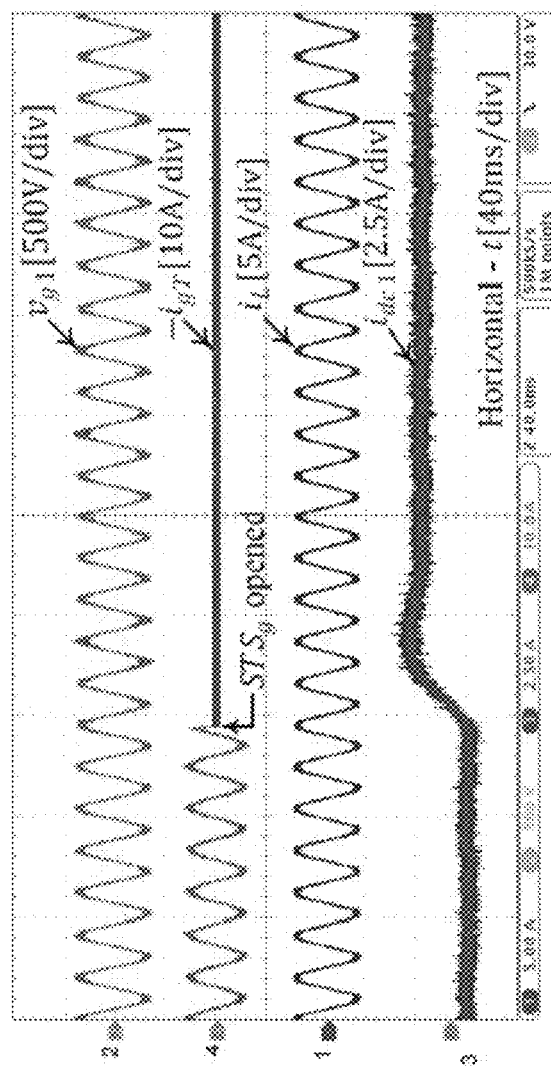
FIG. 15 shows an AC load that does not experience any disturbance (uninterrupted load current when the system is islanded unintentionally by opening $STS_g$ in accordance with embodiments of the present disclosure.
Figure 16:
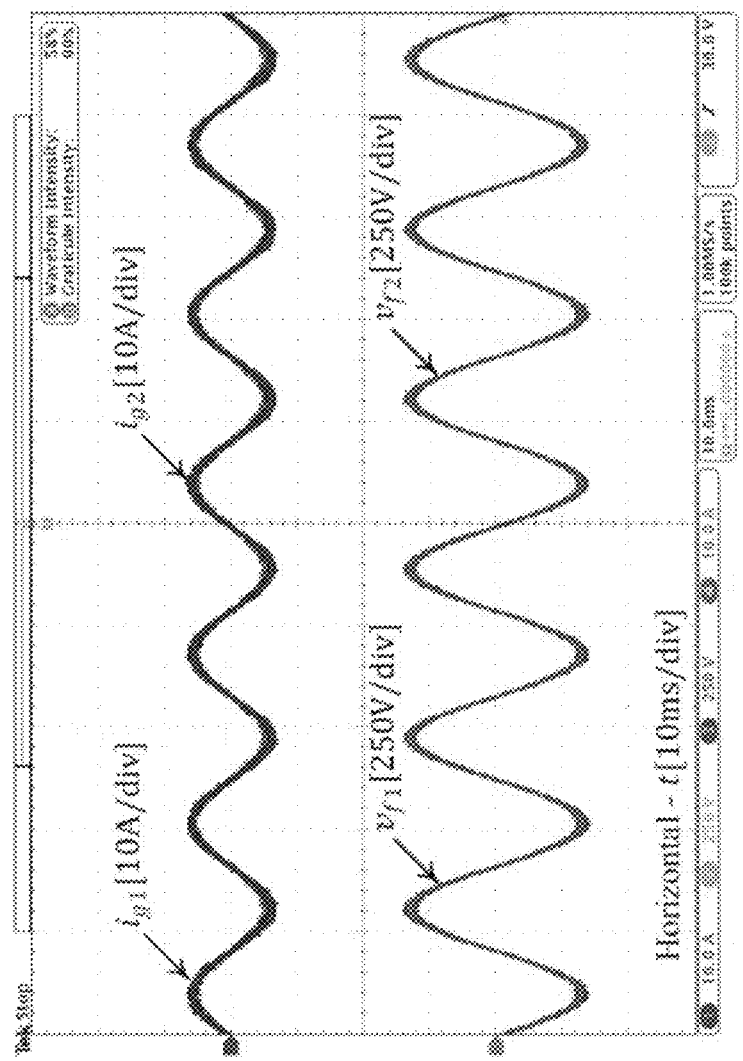
FIG. 16 shows interlinking converters (ILC1 and ILC2) serving the AC load in islanded condition ($STS_g$ open; $STS_1$ and $STS_2$ are closed) in accordance with embodiments of the present disclosure.

Next, unintentional islanding is demonstrated in FIG. 15. Prior to disconnecting from the grid by opening $STS_g$, the ILC1 draws real power from the grid ($i_{dc1}<0$). At the opening of $STS_g$, marked by the transition in grid current $i_{gT}$ the power-flow through the ILC1 reverses immediately and the load current $i_L$ does not experience any noticeable disturbance. Islanded operation ($STS_g$ open) of the hybrid AC-DC microgrid system is illustrated in FIG. 16, where the two interlinking converters ILC1 and ILC2 serve the AC load.

Figure 17:
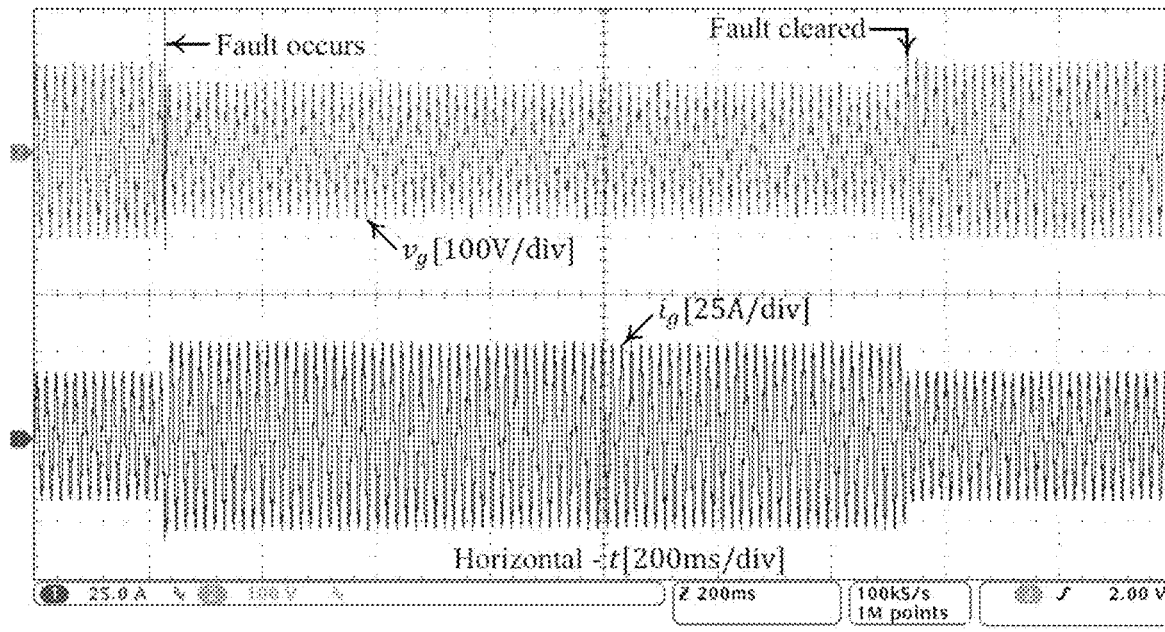
FIG. 17 shows a ride-through response of a GFM converter using an exemplary DSUVOC when subjected to an AC fault through an impedance of 53% p.u. under islanded condition in accordance with embodiments of the present disclosure.
Figure 18:
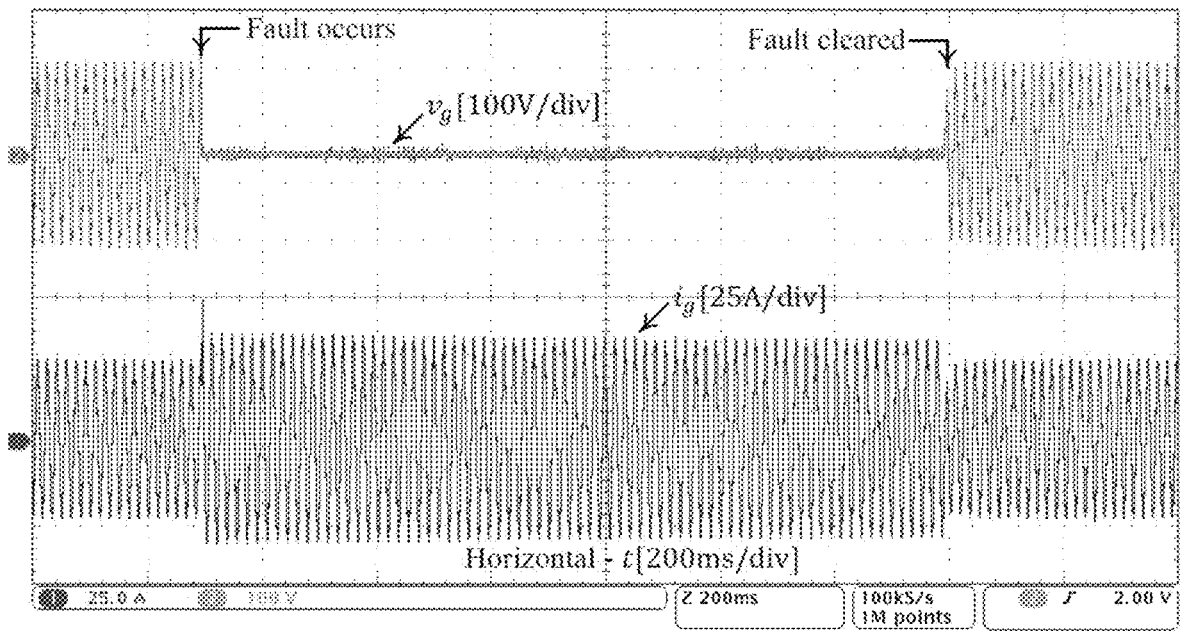
FIG. 18 shows a ride-through response of a grid forming (GFM) power electronic converter using an exemplary DSUVOC when subjected to a dead-short at the converter terminal in, accordance with embodiments of the present disclosure.

An additional set of experiments is performed to validate the fault ride-through capability of the power electronic converter with DSUVOC control. FIG. 17 shows the converter response when an AC fault occurs through an impedance of 53% p.u. during islanded operation. Prior to the fault, the converter supplies a local load of 100% p.u. and the fault is introduced by shorting the load terminals. The converter output current is immediately limited to the maximum value $I_m$=120% p.u. allowable by the converter hardware. The converter returns to normal operation as soon as the fault is cleared. FIG. 18 shows the converter response when a dead short is introduced at the converter terminal. The output current is clamped to $I_m$ and normal operation is retained as soon as the fault is cleared.

Figure 19A:
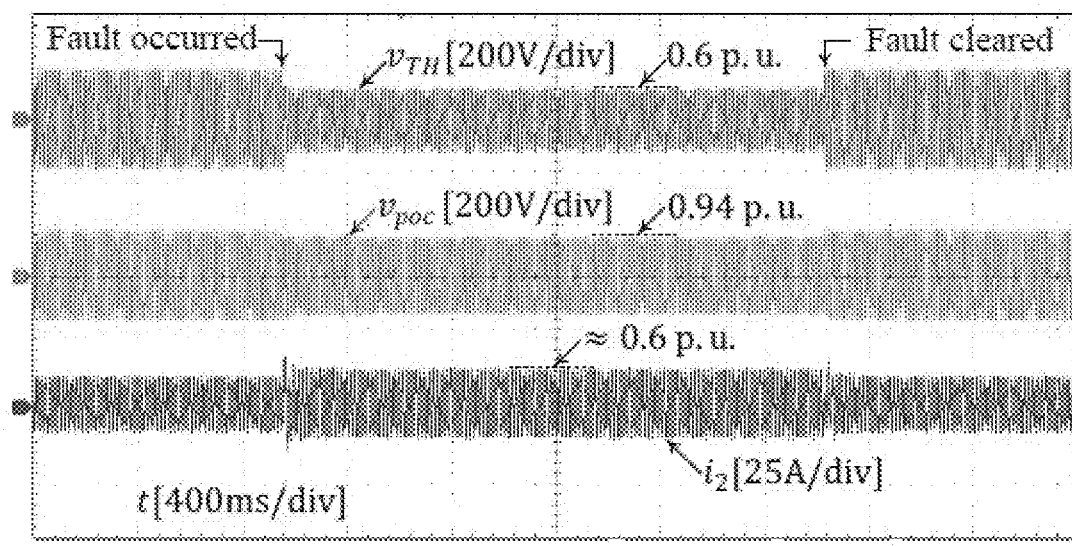
FIG. 19A-19C show ride-through response of a GFM converter under grid-tied operation when a converter current limit is not reached for (A) an overall response of fault occurring and clearing, (B) a zoomed-in response of the instant when fault occurs, and (C) a zoomed-in response of the instant when a fault is cleared, in accordance with embodiments of the present disclosure.
Figure 19B:
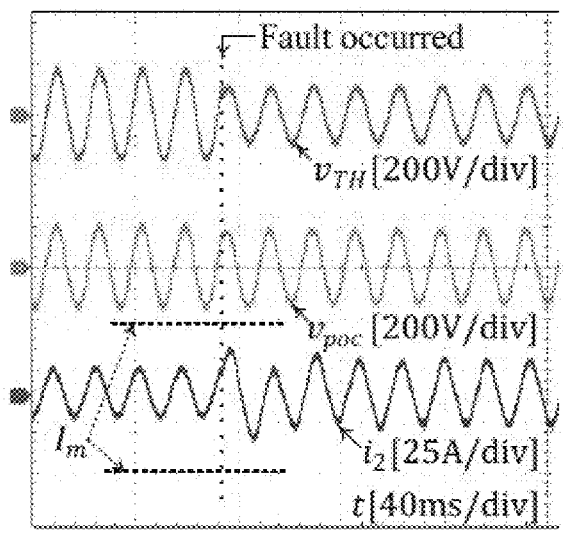
Figure 19C:
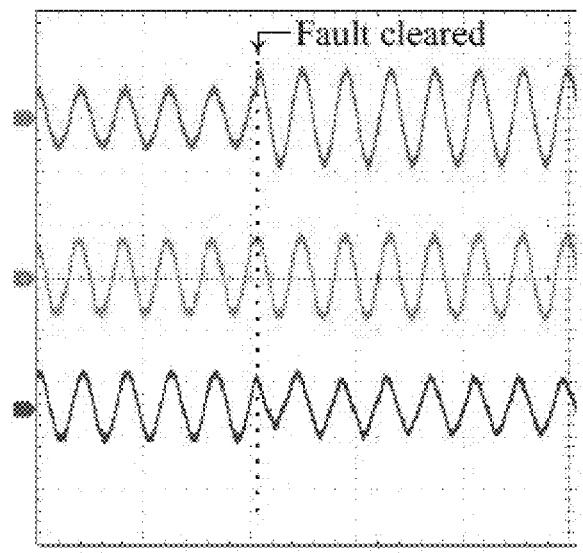
Figure 20A:
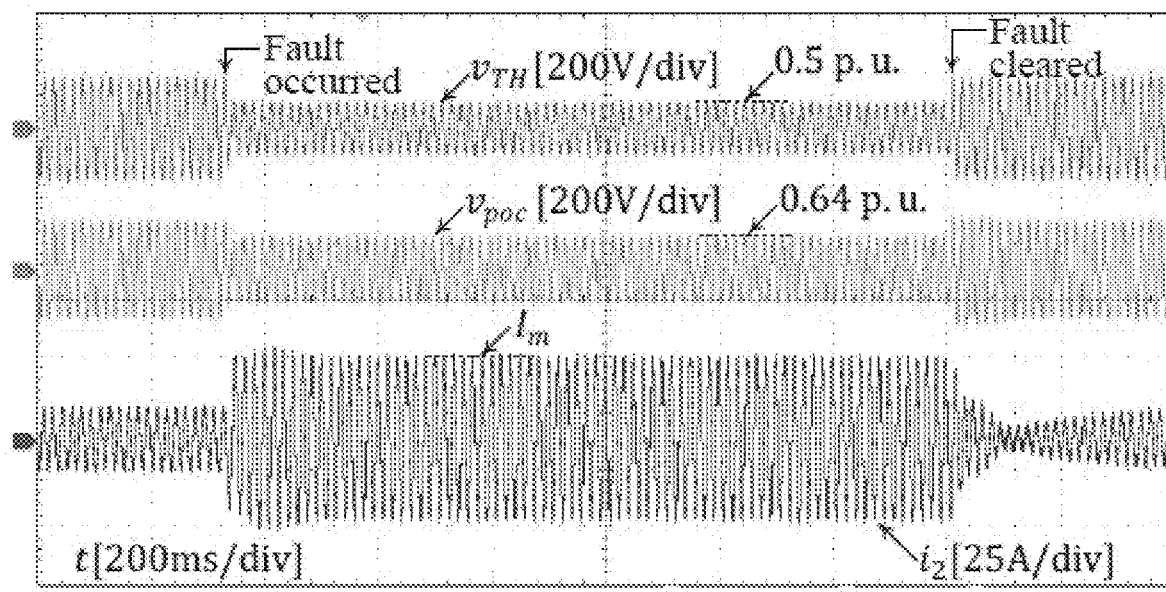
FIG. 20A-20C show a ride-through response of a GFM converter under grid-tied operation when a converter current limit is reached for (A) an overall response of fault occurring and clearing, (B) a zoomed-in response of the instant when fault occurs, and (C) a zoomed-in response of the instant when a fault is cleared, in accordance with embodiments of the present disclosure.
Figure 20B:
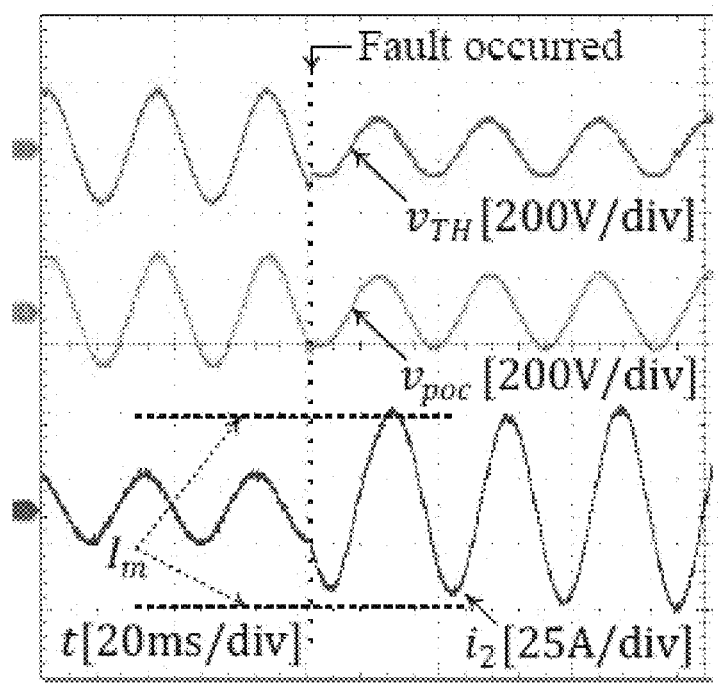
Figure 20C:
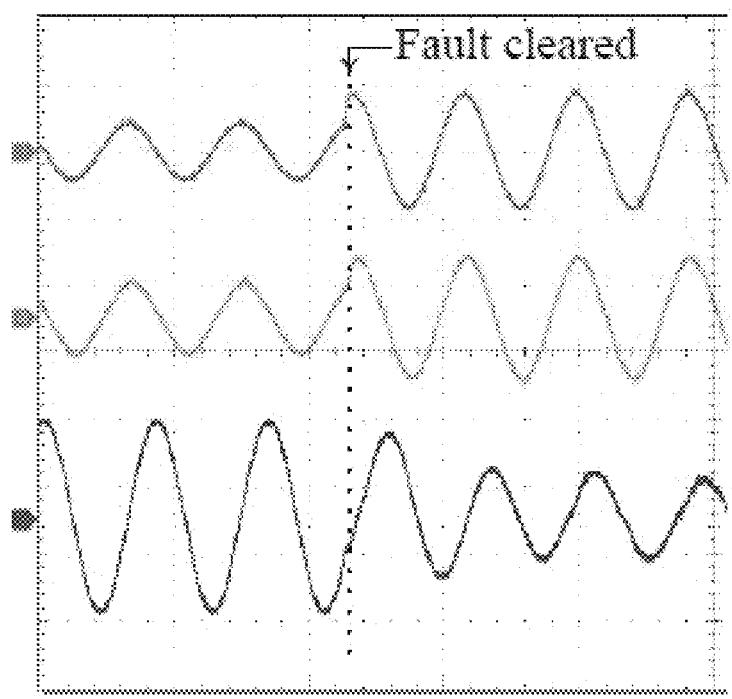

Next, the fault ride-through capability of the DSUVOC controller is tested under grid-tied operation. While connected to a grid (emulated by a programmable AC source $v_{TH}$ and an impedance $Z_{TH}$), a sudden voltage sag is introduced to emulate a grid fault. FIG. 19A shows the converter response when the converter output current does not reach the current limit $I_m$ under fault conditions, in which the converter output current is denoted as $i_2$. The converter injects reactive power to provide voltage support at the PoC and normal operation is retained once the fault is cleared. The instants when a fault occurs and when the fault is cleared are shown in FIG. 19B and FIG. 19C, respectively. Correspondingly, FIG. 20A shows the converter responses under a more sever grid fault when the converter output current hits the maximum allowable value $I_m$. The instants when fault occurs and when fault is cleared are shown in FIG. 20B and FIG. 20C, respectively.

Figure 21:
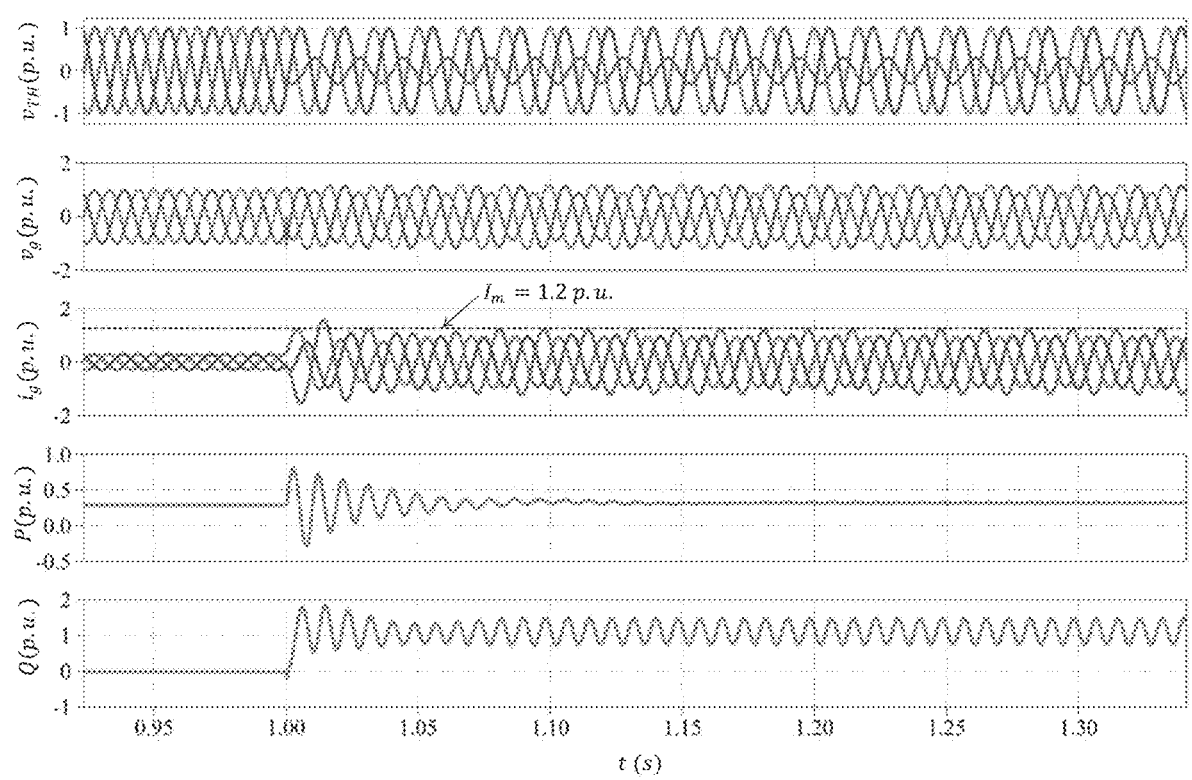
FIG. 21 shows a ride-through response of a GFM converter under grid-tied operation when subjected to a single line to ground fault and an exemplary DSUVOC is programmed to achieve constant real power flow under a fault condition, in accordance with embodiments of the present disclosure.

Next, FIG. 21 shows the simulated ride-through response under an asymmetric/unbalanced grid fault. For this set of tests, both positive and negative sequence space vector oscillators are used and the double sequence current reference generation is performed following Equation (1) to achieve constant real power flow at the converter output during an asymmetric/unbalanced fault. The equivalent three phase AC voltage source $v_{TH}$ is used to emulate a single line to ground fault, i.e., one of the three phase voltages is suddenly lowered from 1 p.u. to 0.3 p.u. As soon as the fault is detected in the output current, i.e., $i_g > I_m$, the DSUVOC controller clamps the output current at $I_m$. From the real power waveform, it is evident that despite the initial transient at the instant when fault occurs, the desired constant real power flow is achieved under the fault condition.

Figure 22A:
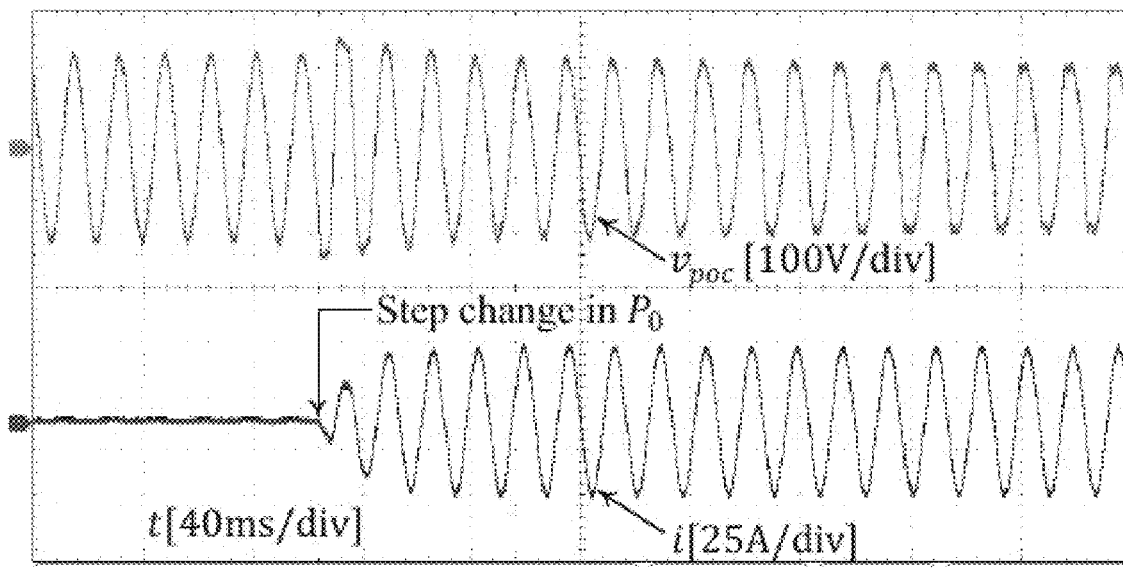
FIG. 22A-22D show a robust response of an exemplary DSUVOC based power electronic converter under a strong grid (short-circuit ratio of 10) and an ultra-weak grid (short-circuit ratio of 1) using identical set of control parameters for (A) a no-load to full-load step response under strong grid, (B) a full-load to no-load step response under strong grid, (C) a no-load to full-load step response under ultra-weak grid, and (D) a full-load to no-load step response under an ultra-weak grid, in accordance with embodiments of the present disclosure.
Figure 22B:
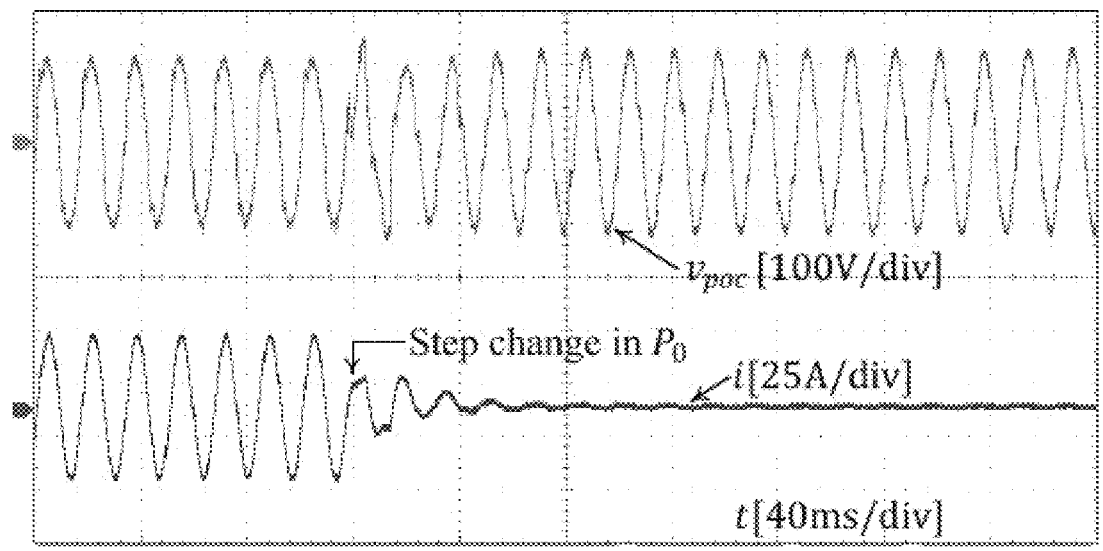
Figure 22C:
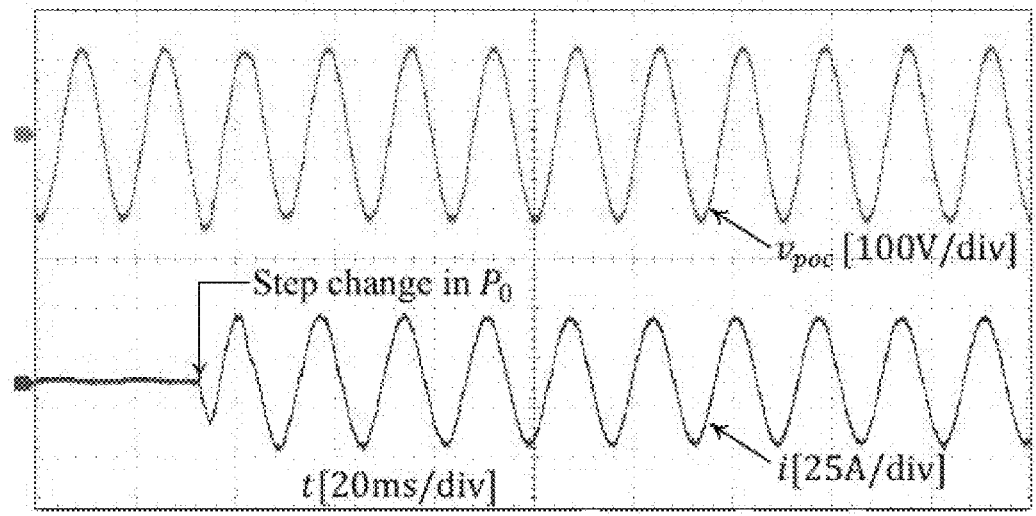
Figure 22D:
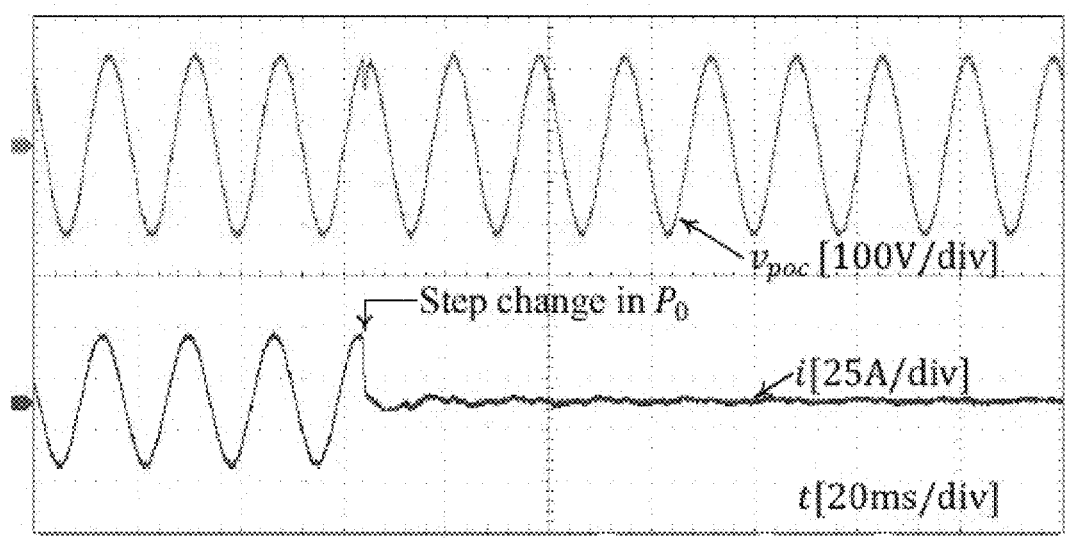

Due to its enhanced synchronization capability, an exemplary DSUVOC can enable stable converter operation under widely varying grid impedance conditions without the need for any change/tuning of control parameters. FIG. 22A-22B show converter operation under a strong grid with grid impedance of 10% p.u. FIG. 22A and FIG. 22B show no-load to full-load and full-load to no-load step responses, respectively; and FIG. 22C-22D show the converter response using identical control parameters under an ultra-weak grid with a grid impedance of 100%. No-load to full-load and full-load to no-load step responses are shown in FIG. 22C and FIG. 22D, respectively.

In accordance with embodiments of the present disclosure, an exemplary DSUVOC provides a comprehensive solution for grid following and grid forming converters. Through experiments, an exemplary GFL controller is shown to retain synchronization with the grid without a dedicated PLL. DC bus voltage regulation is also demonstrated using an exemplary GFL controller. The GFM controller achieves seamless transition from islanded to grid-connected mode using the PLL-less pre-synchronization method as well as serving local loads without interruption in an event of unintentional islanding. Both symmetrical and asymmetrical fault ride-through operations under islanded and grid-tied operations have been demonstrated. Robust converter operation under widely varying grid impedances ranging from 10% p.u. to 100% p.u. using identical control parameters has been achieved.

An exemplary double synchronous unified virtual oscillator controller has several advantages over existing grid-forming and grid following power electronic converter technologies. While grid-forming converters are the fundamental building blocks in self-sustaining microgrid applications, an exemplary double synchronous unified virtual oscillator controller reduces the number of voltage and current sensors in half compared to existing grid forming control methods, thereby leading to lower cost. Further, an exemplary DSUVOC controller is easily scalable enabling plug-and-play type application, thereby simplifying commissioning in the field. For grid following operations, an exemplary DSUVOC controller enables grid synchronization without phase-locked-loops which can be very useful in weak grid and ultra-weak grid conditions. For example, in an HVDC-VSC (High Voltage Direct Current-Voltage Source Converter) application, an exemplary DSUVOC controller is expected to give significant performance improvement in terms of stability.

An exemplary double synchronous unified virtual oscillator controller enables fast over-current limiting and ride-through of both balanced/symmetric and unbalanced/asymmetric AC faults without the need for switching to a back-up-controller. Additionally, a PLL is not required for such fault ride-through or any mode of operation in both grid following and grid forming power electronic converters. Due to its PLL nature, robust synchronization under a variable grid condition is achieved, while a stable converter operation is achieved using identical control parameters irrespective of grid impedance variations ranging from 10% p.u. to 100 p.u.

Potential applications of an exemplary grid-forming controller include, but are not limited to, battery energy storage systems, parallel UPS (uninterruptible power supply) systems, interfacing converters for distributed and renewable (such as solar, wind and wave) energy resources, and solid-state-transformers. Potential applications of an exemplary grid-following controller include, but are not limited to, a PV (photovoltaic) inverter, wind power converter, an active-front-end motor drive, HVDC-VSC, and UPS. A grid following controller may also be used in STATCOM (static synchronous compensator) and active power filter applications. The robust synchronizing capability irrespective of grid impedance variations can substantially reduce the cost of commissioning/deployment and maintenance of power electronic converter under changing grid conditions.

In brief, a power electronic converter can utilize exemplar DSUVOC control logic or circuitry to convert direct current to alternating current that is input into a power grid. An exemplary DSUVOC controller includes a double synchronous space vector oscillator component, a sequence extraction (SE) component, a fault detection (FD) component, a pre-synchronization (PS) component, a virtual impedance (VI) component, a terminal voltage compensation (TVC) component, and/or an active damping (AD) component, wherein the double synchronous unified virtual oscillator controller is configured to control the power electronic converter for both grid forming and grid following modes of operation. In various embodiments, a processor of a power electronics converter can be configured to implement the DSUVOC control operations described herein. Accordingly, such operations can be programmed on a digital controller, in various embodiments.

It should be emphasized that the above-described embodiments are merely possible examples of implementations, merely set forth for a clear understanding of the principles of the present disclosure. Many variations and modifications may be made to the above-described embodiment(s) without departing substantially from the principles of the present disclosure. All such modifications and variations are intended to be included herein within the scope of this disclosure.

REFERENCES

[1] F. Milano, F. Dörfler, G. Hug, D. J. Hill, and G. Verbič, "Foundations and Challenges of Low-Inertia Systems (Invited Paper)," in 2018 *Power Systems Computation Conference (PSCC)*, June 2018, pp. 1-25.

[2] J. Matevosyan, B. Badrzadeh, T. Prevost, E. Quitmann, D. Ramasubramanian, H. Urdal, S. Achilles, J. MacDowell, S. H. Huang, V. Vital, J. O'Sullivan, and R. Quint, "Grid-Forming Inverters: Are They the Key for High Renewable Penetration?" *IEEE Power and Energy Magazine*, vol. 17, no. 6, pp. 89-98, November 2019.

[3] J. Rocabert, A. Luna, F. Blaabjerg, and P. Rodriguez, "Control of Power Converters in AC Microgrids," *IEEE Transactions on Power Electronics*, vol. 27, no. 11, pp. 4734-4749, November 2012.

[4] L. Zhang, L. Harnefors, and H. Nee, "Power-Synchronization Control of Grid-Connected Voltage-Source Converters," IEEE Transactions on Power Systems, vol. 25, no. 2, pp. 809-820, May 2010.

[5] Q.-C. Zhong and G. Weiss, "Synchronverters: Inverters That Mimic Synchronous Generators," *IEEE Transactions on Industrial Electronics*, vol. 58, no. 4, pp. 1259-1267, April 2011.

[6] H.-P. Beck and R. Hesse, "Virtual Synchronous Machine," in 2007 $9^{th}$ *International Conference on Electrical Power Quality and Utilisation*. Barcelona, Spain: IEEE, October 2007, pp. 1-6.

[7] W. Zhang, A. M. Cantarellas, J. Rocabert, A. Luna and P. Rodriguez, "Synchronous Power Controller With Flexible Droop Characteristics for Renewable Power Generation Systems," in IEEE Transactions on Sustainable Energy, vol. 7, no. 4, pp. 1572-1582, October 2016, doi: 10.1109/TSTE.2016.2565059.

[8] B. B. Johnson, S. V. Dhople, A. O. Hamadeh, and P. T. Krein, "Synchronization of Parallel Single-Phase Inverters With Virtual Oscillator Control," *IEEE Transactions on Power Electronics*, vol. 29, no. 11, pp. 6124-6138, November 2014.

[9] B. B. Johnson, M. Sinha, N. G. Ainsworth, F. Dorfler, and S. V. Dhople, "Synthesizing Virtual Oscillators to Control Islanded Inverters," *IEEE Transactions on Power Electronics*, vol. 31, no. 8, pp. 6002-6015, August 2016.

[10] M. A. Awal, H. Yu, H. Tu, S. M. Lukic, and I. Husain, "Hierarchical Control for Virtual Oscillator Based Grid-Connected and Islanded Microgrids," *IEEE Transactions on Power Electronics*, vol. 35, no. 1, pp. 988-1001, January 2020.

[11] M. Colombino, D. Gross, J. Brouillon, and F. Dörfler, "Global Phase and Magnitude Synchronization of Coupled Oscillators with Application to the Control of Grid-Forming Power Inverters," *IEEE Transactions on Automatic Control*, pp. 1-1, 2019.

[12] M. Colombino, D. Groß, and F. Dörfler, "Global Phase and Voltage Synchronization for Power Inverters: A Decentralized Consensus-Inspired Approach," in 2017 *IEEE 56th Annual Conference on Decision and Control (CDC)*, December 2017, pp. 5690-5695.

[13] G. Seo, M. Colombino, I. Subotic, B. Johnson, D. Groß, and F. Dörfler, "Dispatchable Virtual Oscillator Control for Decentralized Inverter-dominated Power Systems: Analysis and Experiments," in 2019 *IEEE Applied Power Electronics Conference and Exposition (APEC)*, March 2019, pp. 561-566.

[14] S. H. Strogatz, *Nonlinear Dynamics and Chaos: with Applications to Physics, Biology, Chemistry, and Engineering.* Westview Press, 2015.

[15] A. D. Paquette and D. M. Divan, "Virtual Impedance Current Limiting for Inverters in Microgrids With Synchronous Generators," IEEE Trans-actions on Industry Applications, vol. 51, no. 2, pp. 1630-1638, March 2015.

[16] K. O. Oureilidis and C. S. Demoulias, "A fault clearing method in converter-dominated microgrids with conventional protection means," IEEE Transactions on Power Electronics, vol. 31, no. 6, pp. 4628-4640, June 2016.

[17] K. Shi, H. Ye, P. Xu, D. Zhao, and L. Jiao, "Low-voltage ride through control strategy of virtual synchronous generator based on the analysis of excitation state," IET Generation, Transmission Distribution, vol. 12, no. 9, pp. 2165-2172, 2018.

[18] M. G. Taul, X. Wang, P. Davari, and F. Blaabjerg, "Current Limiting Control with Enhanced Dynamics of Grid-Forming Converters during Fault Conditions," IEEE Journal of Emerging and Selected Topics in Power Electronics, pp. 1-1, 2019.

[19] P. Rodriguez, J. Pou, J. Bergas, J. I. Candela, R. P. Burgos and D. Boroyevich, "Decoupled Double Synchronous Reference Frame PLL for Power Converters Control," in IEEE Transactions on Power Electronics, vol. 22, no. 2, pp. 584-592, March 2007, doi: 10.1109/TPEL.2006.890000.

[20] D. Zhu, S. Zhou, X. Zou, and Y. Kang, "Improved Design of PLL Controller for LCL-Type Grid-Connected Converter in Weak Grid," IEEE Transactions on Power Electronics, vol. 35, no. 5, pp. 4715-4727, 2020.

[21] M. A. Awal, H. Yu, I. Husain, W. Yu and S. M. Lukic, "Selective Harmonic Current Rejection for Virtual Oscillator Controlled Grid-Forming Voltage Source Converters," in IEEE Transactions on Power Electronics, vol. 35, no. 8, pp. 8805-8818, August 2020, doi: 10.1109/TPEL.2020.2965880.

[22] M. A. Awal, H. Yu, L. D. Flora, W. Yu, S. Lukic and I. Husain, "Observer Based Admittance Shaping for Resonance Damping in Voltage Source Converters with LCL Filter," 2019 IEEE Energy Conversion Congress and Exposition (ECCE), Baltimore, Md., USA, 2019, pp. 4455-4462, doi: 10.1109/ECCE.2019.8913194.

[23] S. C. Chapra and R. P. Canale, *Numerical Methods for Engineers*. McGraw-Hill, 2003.

[24] M. A. Awal and I. Husain, "Unified Virtual Oscillator Control for Grid-Forming and Grid-Following Converters," in IEEE Journal of Emerging and Selected Topics in Power Electronics, doi: 10.1109/JESTPE.2020.3025748.

Therefore, at least the following is claimed:

1. A double synchronous unified virtual oscillator controller of a power electronic converter in a power grid, comprising:
 a double synchronous space vector oscillator configured to generate a voltage vector output using feedback of an output current of the power electronic converter, the double synchronous space vector oscillator comprising a double sequence current reference generation component, a double sequence vector limiter component, a positive sequence space vector oscillator component, and a negative sequence space vector oscillator component;
a sequence extraction component that is configured to extract positive and negative sequence symmetrical components of the output current of the power electronic converter;
a fault detection component that is configured to detect and latch a fault condition based on the feedback of the output current of the power electronic converter or a grid voltage at a point-of-coupling of the power electronic converter with the power grid;
a virtual impedance component that is configured to achieve harmonic current suppression in the output current of the power electronic converter;
an observer based active damping component that is configured to achieve resonance damping in a high frequency range originating from a higher-order filter of the power electronic converter, wherein the higher-order filter is at least a second order filter;
a terminal voltage compensation component that is configured to compensate a voltage deviation due to the higher-order filter or other non-ideal effects of the power electronic converter; and
a pre-synchronization component that is configured to synchronize the double synchronous space vector oscillator with a terminal voltage of the power electronic converter at the point-of-coupling before being connected to the power grid,
wherein the double synchronous unified virtual oscillator controller is configured to control the power electronic converter for both grid forming and grid following operations.

2. The double synchronous unified virtual oscillator controller of claim 1, wherein the higher-order filter comprises an LCL filter.

3. The double synchronous unified virtual oscillator controller of claim 1, wherein the power electronic converter connects to the power grid via a static transfer switch.

4. The double synchronous unified virtual oscillator controller of claim 1, wherein the double synchronous unified virtual oscillator controller is configured to provide grid synchronization in a grid-following mode of operation with bidirectional power flow control capability without using a phase-locked-loop.

5. The double synchronous unified virtual oscillator controller of claim 1, wherein the double synchronous unified virtual oscillator controller is configured to provide DC bus voltage regulation in a grid-following mode of operation without a phase-locked-loop.

6. The double synchronous unified virtual oscillator controller of claim 1, wherein the double synchronous unified virtual oscillator controller is configured to implement a grid forming mode of operation that implements a droop response for both grid connected and islanded operations.

7. The double synchronous unified virtual oscillator controller of claim 6, wherein the double synchronous unified virtual oscillator controller is implemented using an error in voltage vector magnitude in a voltage magnitude correction term.

8. The double synchronous unified virtual oscillator controller of claim 6, wherein the double synchronous unified virtual oscillator controller is implemented using an error in square of voltage vector magnitude in a voltage magnitude correction term.

9. The double synchronous unified virtual oscillator controller of claim 6, wherein the double synchronous unified virtual oscillator controller is configured to generate a switching duty ratio based on a DC bus voltage measurement.

10. The double synchronous unified virtual oscillator controller of claim 6, wherein the double synchronous unified virtual oscillator controller is configured to provide voltage regulation support without communication through a communication network.

11. The double synchronous unified virtual oscillator controller of claim 1, wherein the double synchronous unified virtual oscillator controller is configured to enable grid synchronization of a grid following power electronic converter or a grid forming power electronic converter under balanced and unbalanced grid voltage conditions without operation of a phase-locked-loop.

12. The double synchronous unified virtual oscillator controller of claim 1, wherein the double synchronous unified virtual oscillator controller is configured to enable a ride-through of balanced and unbalanced grid faults by limiting the output current of the power electronic converter without switching to a phase-locked-loop based back-up controller.

13. The double synchronous unified virtual oscillator controller of claim 1, wherein the double synchronous unified virtual oscillator controller is configured to enable grid synchronization of the power electronic converter under variable grid impedance conditions without tuning of control parameters.

14. The double synchronous unified virtual oscillator controller of claim 1, wherein the virtual impedance component is configured to suppress harmonic distortion in the output current of a grid-following power electronic converter or a grid-forming power electronic converter.

15. The double synchronous unified virtual oscillator controller of claim 1, wherein the terminal voltage compensation component is configured to eliminate a voltage deviation caused by the higher-order filter of the power electronic converter.

16. The double synchronous unified virtual oscillator controller of claim 1, wherein the double sequence vector limiter component is configured to limit a reference of the output current of the power electronic converter within limits allowable by power electronic converter hardware.

17. The double synchronous unified virtual oscillator controller of claim 1, wherein the positive sequence space vector oscillator component and the negative sequence space vector oscillator component are configured to enable simultaneous synchronization with positive and negative sequence symmetrical components of the grid voltage without operation of a phase-locked-loop.

18. The double synchronous unified virtual oscillator controller of claim 1, wherein active resistances in the positive and negative sequence space vector oscillator components are configured to enable over-current limiting protection under fault conditions.

19. The double synchronous unified virtual oscillator controller of claim 1, wherein the pre-synchronization component is configured to achieve start-up in a grid-following power electronic converter or seamless islanded to grid connected transition in a grid forming power electronic converter without operation of a phase-locked-loop.

20. The double synchronous unified virtual oscillator controller of claim 1, wherein the double sequence current reference generation component is configured to achieve different control objectives in the power electronic converter, wherein the different control objectives include at least one of constant real power flow, constant reactive power flow, or balanced output current.

* * * * *